US007126161B2

(12) United States Patent
Yamazaki

(10) Patent No.: US 7,126,161 B2
(45) Date of Patent: Oct. 24, 2006

(54) SEMICONDUCTOR DEVICE HAVING EL LAYER AND SEALING MATERIAL

(75) Inventor: Shunpei Yamazaki, Setegaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 10/951,809

(22) Filed: Sep. 29, 2004

(65) Prior Publication Data

US 2005/0087772 A1    Apr. 28, 2005

Related U.S. Application Data

(62) Division of application No. 09/412,512, filed on Oct. 5, 1999, now abandoned.

(30) Foreign Application Priority Data

Oct. 13, 1998 (JP) ............... 10-290802
Oct. 19, 1998 (JP) ............... 10-297359

(51) Int. Cl.
*H01L 33/00* (2006.01)

(52) U.S. Cl. .................. 257/98; 257/99; 257/E33.061; 313/512

(58) Field of Classification Search .......... 257/59, 257/72, 347–354, 682, 98, 99, E33.061; 313/512
See application file for complete search history.

(56) References Cited

U.S. PATENT DOCUMENTS

| 5,147,826 A | 9/1992 | Liu et al. |
| 5,236,850 A | 8/1993 | Zhang |
| 5,275,851 A | 1/1994 | Fonash et al. |
| 5,476,810 A | 12/1995 | Curran |
| 5,492,843 A | 2/1996 | Adachi et al. |
| 5,550,066 A * | 8/1996 | Tang et al. ............. 438/29 |
| 5,643,826 A | 7/1997 | Ohtani et al. |
| 5,773,327 A | 6/1998 | Yamazaki et al. |
| 5,798,744 A * | 8/1998 | Tanaka et al. .......... 345/92 |
| 5,882,761 A * | 3/1999 | Kawami et al. ......... 428/69 |
| 5,923,962 A | 7/1999 | Ohtani et al. |
| 5,962,962 A | 10/1999 | Fujita et al. |
| 6,017,779 A | 1/2000 | Miyasaka |
| 6,077,731 A | 6/2000 | Yamazaki et al. |
| 6,146,930 A | 11/2000 | Kobayashi et al. |

(Continued)

FOREIGN PATENT DOCUMENTS

EP    0 485 233    5/1992

(Continued)

OTHER PUBLICATIONS

Jaeger; Introduction to microelectronic fabrication; 1988; Modular series on solid state devices, vol. 5; Addison-Wesley Publishing Company; Reading, Massachusetts; pp. 115.*

(Continued)

*Primary Examiner*—Marcos D. Pizarro
(74) *Attorney, Agent, or Firm*—Eric J. Robinson; Robinson Intellectual Property Law Office, P.C.

(57) ABSTRACT

In the present invention, a semiconductor film is formed through a sputtering method, and then, the semiconductor film is crystallized. After the crystallization, a patterning step is carried out to form an active layer with a desired shape. The present invention is also characterized by forming a semiconductor film through a sputtering method, subsequently forming an insulating film. Next, the semiconductor film is crystallized through the insulating film, so that a crystalline semiconductor film is formed. According this structure, it is possible to obtain a thin film transistor with a good electronic property and a high reliability in a safe processing environment.

46 Claims, 21 Drawing Sheets

U.S. PATENT DOCUMENTS

| | | | |
|---|---|---|---|
| 6,177,302 | B1 | 1/2001 | Yamazaki et al. |
| 6,188,452 | B1 | 2/2001 | Kim et al. |
| 6,285,042 | B1 | 9/2001 | Ohtani et al. |
| 6,335,541 | B1 | 1/2002 | Ohtani et al. |

FOREIGN PATENT DOCUMENTS

| | | |
|---|---|---|
| JP | 64-031466 | 2/1989 |
| JP | 1-270310 | 10/1989 |
| JP | 04-177735 | 6/1992 |
| JP | 7-130652 | 5/1995 |
| JP | 7-263697 | 10/1995 |
| JP | 08-078159 | 3/1996 |
| JP | 09-035868 | 2/1997 |
| JP | 9-283439 | 10/1997 |
| JP | 9-312260 | 12/1997 |
| JP | 09-312260 | 12/1997 |
| JP | 10-229201 | 8/1998 |

OTHER PUBLICATIONS

U.S. Appl. No. 09/352,194, including Specification, Drawings, Pending Claims and Pending Office Action, "Crystalline Semiconductor Thin Film, Method of Fabricating the Same Semiconductor Device, and Method of Fabricating the Same", Shunpei Yamazaki et al., filed Jul. 13, 1999.

U.S. Appl. No. 09/894,125, including Specification, Drawings, Pending Claims and Pending Office Action, "Crystalline Semiconductor Thin Film, Method of Fabricating the Same Semiconductor Device, and Method of Fabricating the Same," Shunpei Yamazaki et al., filed Jun. 29, 2001.

C. S. McCormick et al., "Low Temperature Fabrication of Amorphous Silicon Thin Film Transistors by dc Reactive Magnetron Sputtering," J. Vac. Sci. Technol. A 15(5), Sep./Oct. 1997, pp. 2770-2776.

J. Jang, et al., "32.1: Invited Paper: a-Si TFTs With Planarized Gate Insulators," Society for Information Display International Symposium Digest of Technical Papers, vol. XXX, San Jose Convention Center, San Jose, California, May 18-20, 1999, pp. 728-731.

* cited by examiner

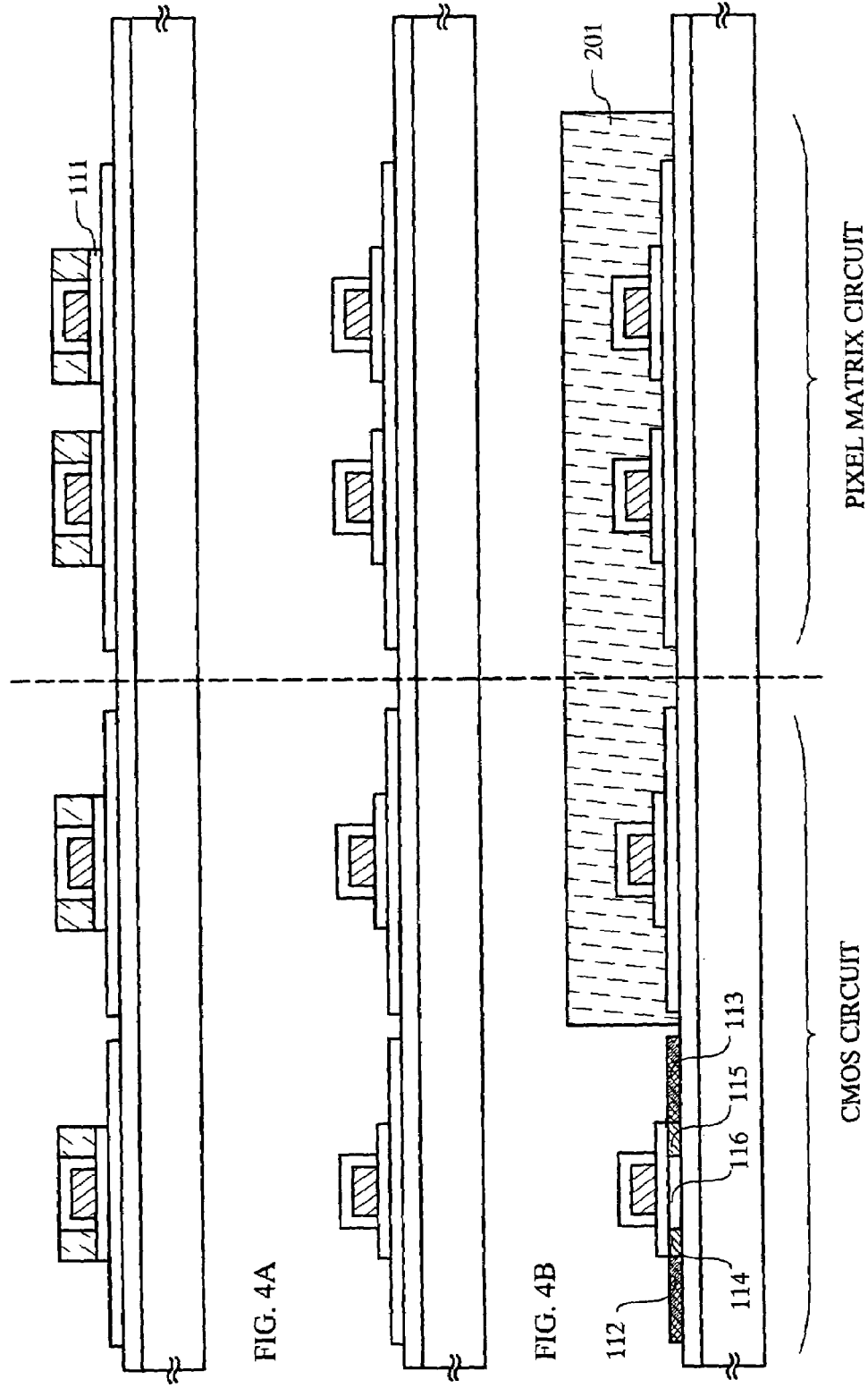

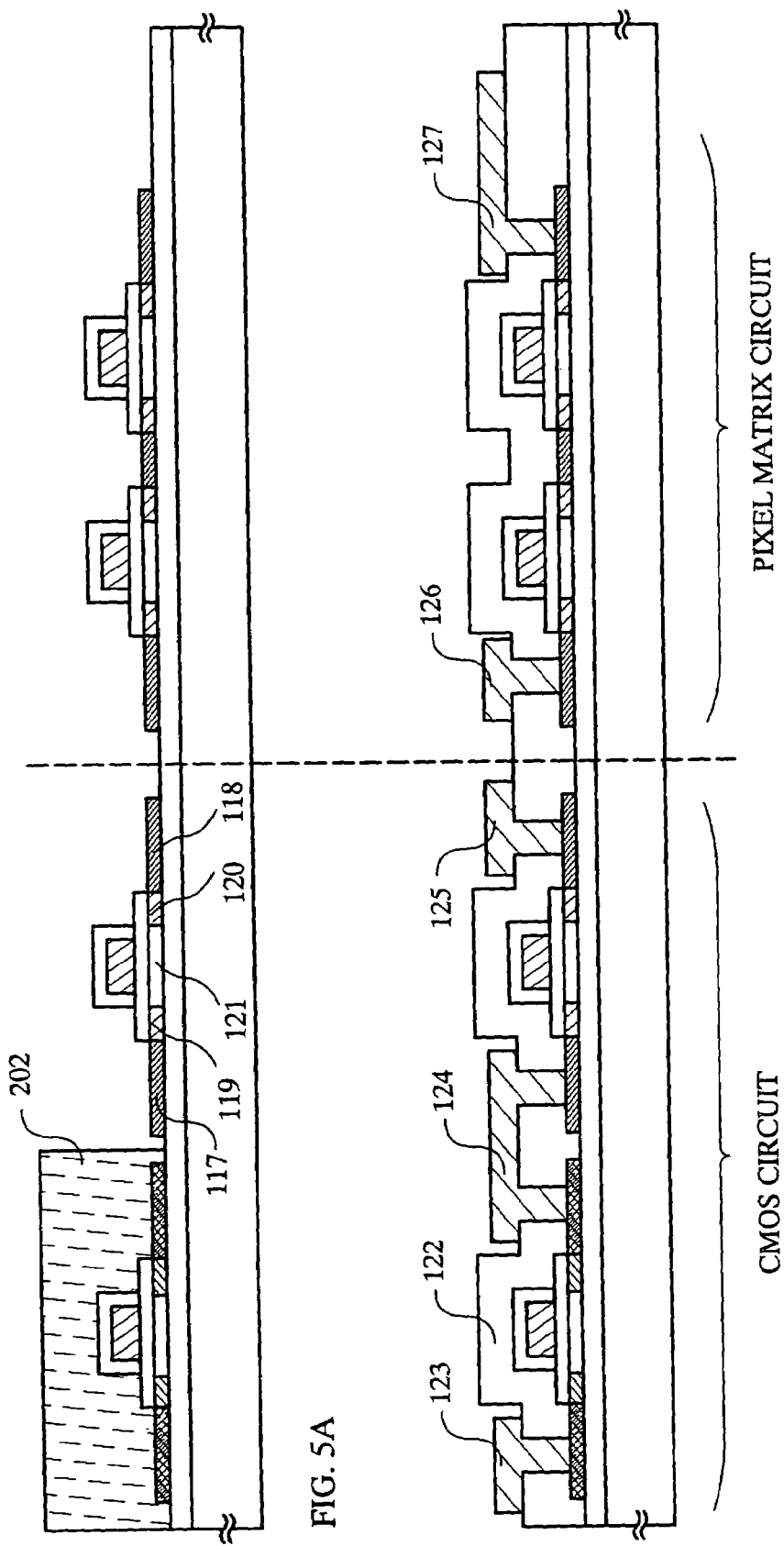

CMOS CIRCUIT
Y - Y'

PIXEL MATRIX CIRCUIT
X - X'

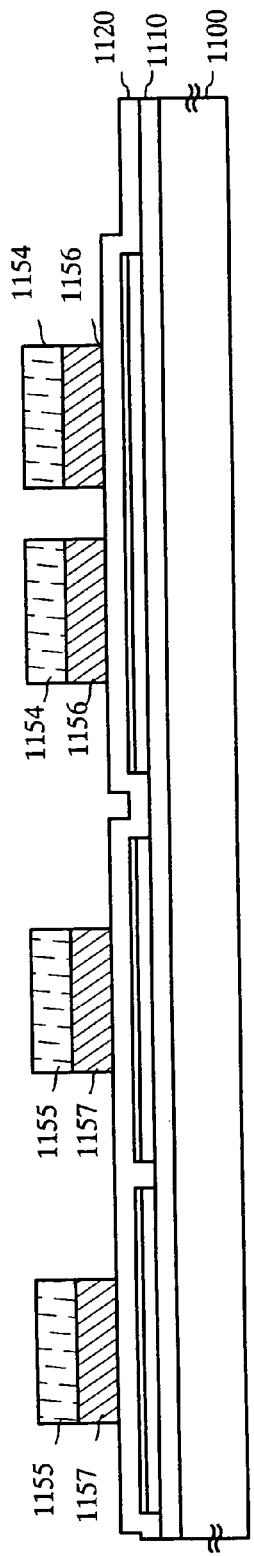
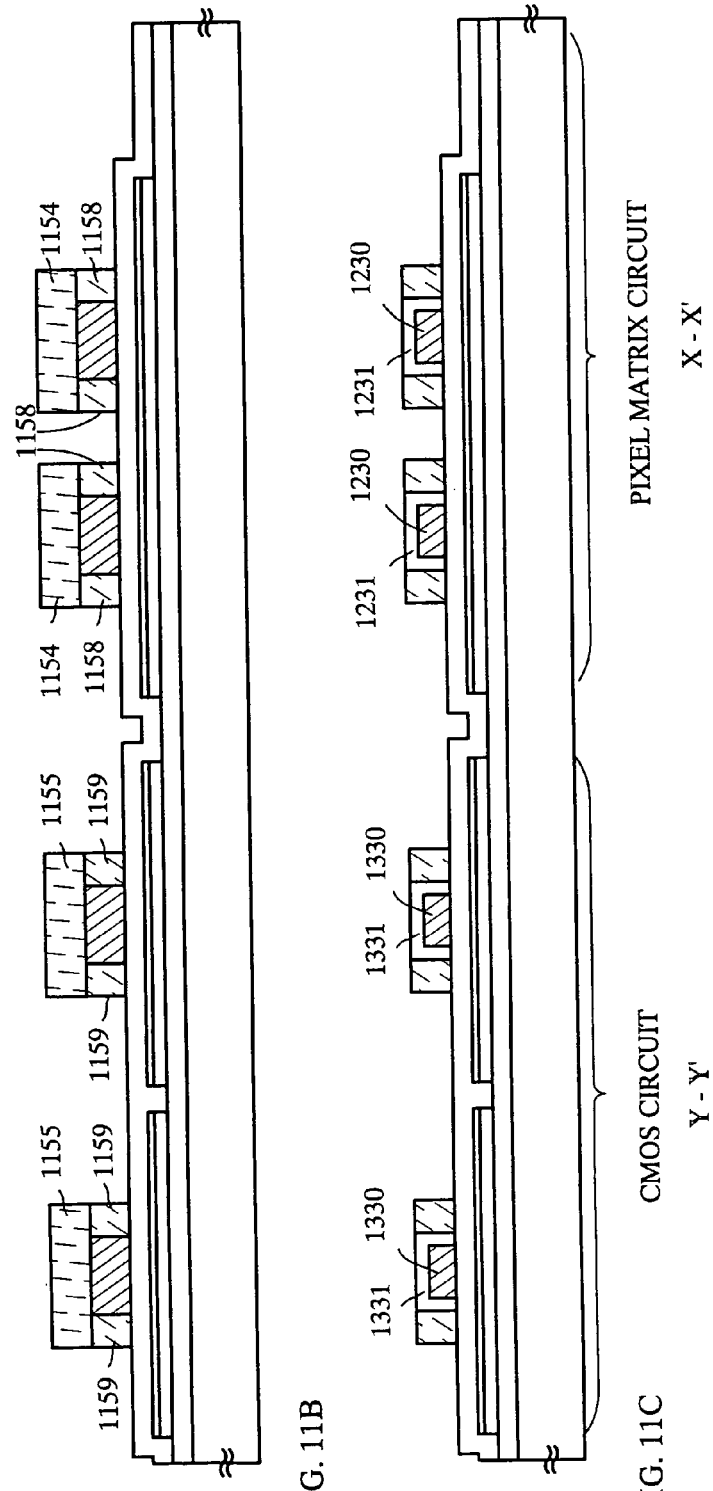
FIG. 11A
FIG. 11B
FIG. 11C

SEMICONDUCTOR DEVICE HAVING EL LAYER AND SEALING MATERIAL

This application is a divisional of application Ser. No. 09/412,512 filed Oct. 5, 1999, now abandoned.

BACKGROUND OF THE INVENTION

1. Field of the Invention

The present invention relates to a semiconductor device including a semiconductor circuit comprising a semiconductor element, such as insulated gate type transistors, and a manufacturing method thereof. In particular, it relates to the technology for forming crystalline semiconductor films on top of insulating surfaces. The semiconductor device of the present invention is not limited to thin film transistors (TFTs), MOS transistor, and other insulated type gate transistor elements themselves, but instead include display devices, image sensors, and other electro-optical devices incorporating semiconductor circuits made from those insulated gate type transistors. In addition, the semiconductor device in the present invention includes electronic equipment incorporating the display devices or electro-optical devices.

2. Description of the Related Art

Active matrix liquid crystal displays, in which a pixel matrix circuit and a drive circuit are comprised of thin film transistors (TFTs) formed on top of a substrate with insulating properties, continue to be a center of attention. Liquid crystal displays from approximately 0.5 to 20 inches in size are in use.

Currently TFTs which have a crystalline semiconductor film as the active layer, such as the representative polysilicon film, are gathering attention in the drive to make a liquid crystal display that is capable of high definition display.

A crystalline semiconductor film is formed by initially forming an amorphous semiconductor film, such as the representative amorphous silicon film, and then crystallizing it. In general, chemical vapor deposition (CVD) is used to form the amorphous semiconductor film.

Until now, the low pressure CVD method, which can deposit a good quality amorphous silicon film, as well as the plasma CVD method, which has good throughput and deposits an amorphous silicon film at low temperature, have often been employed.

The speed that reduced pressure CVD can form an amorphous semiconductor film is slow, a disadvantage from a manufacturing perspective.

In addition, plasma CVD forms an amorphous semiconductor film by decomposition of a high priced reactive gas (monosilane, disilane, etc.) using sufficient RF power, but at that time, in addition to the amorphous semiconductor film, a large amount of a yellow powder is generated through a polymerization reaction. This powder is ultrafine, and is known to cause powder explosions when exposed to the atmosphere.

Therefore, due to the great danger of an explosion, a process that uses plasma CVD has a disadvantage from a workplace safety perspective.

Additionally, in the past, after the formation of the amorphous semiconductor film, several other processes are carried out (for example, crystallization, patterning) before the gate insulating film is actually formed. This means the surface of the crystallized silicon film, which is to become the active layer, is exposed to the atmosphere and may become either contaminated with impurities (oxygen, moisture, boron, sodium) or oxidized before the gate insulating film can be formed. Then when the gate insulating film is laminated on top, the active layer, especially the interface between the channel formation region and the gate insulating film, properties drop, and this causes a drop in the electrical characteristics of the TFT.

This is especially true for the atmosphere in clean rooms, in which boron (boric) from the HEPA type filter generally in use can cause boron to intermix with the exposed surface of the film in uneven concentrations. To make a glass mesh structure for the HEPA filter with ease, glass contains a high level of boron. In addition, after measuring the electrical characteristics of the TFT, it has been found that the boron inhibits crystallization during the semiconductor film crystallization process.

SUMMARY OF THE INVENTION

In accordance with the background described above, an object of the present invention is to provide a process that can deposit a film at low temperature, and by forming an amorphous semiconductor film using sputtering method of superior productivity, and that has a high level of safety.

In addition, an object of the present invention is to provide a semiconductor device, which includes a semiconductor circuit made from a semiconductor element with high quality electrical characteristics. The high quality electrical characteristics result by using sputtering to form an amorphous semiconductor film and then crystallizing the film, with the resulting crystalline semiconductor film as the active layer forming a good interface with the insulating film.

In order to obtain the above objects, the present invention is characterized by using sputtering to form a semiconductor film, then crystallizing the film, resulting in formation of a crystalline semiconductor film. It is also characterized by using sputtering to form a base film as well as a gate insulating film.

In addition, the present invention is characterized by using sputtering to form a semiconductor film, and then after successive formation of an insulating film, performing crystallization through the insulating film, resulting in the formation of a crystalline semiconductor film.

This type of composition realizes a TFT with good electrical characteristics through use of a process that provides a safe work environment.

A first aspect of the present invention is a semiconductor device which includes a semiconductor circuit made from a semiconductor element having an active layer and an insulating film in contact with the active layer on the surface of an insulator, the element characterized in that the active layer is a semiconductor film formed by sputtering and crystallized while in contact with the insulating film.

In the first aspect of the present invention, the element is characterized in that the sputtering method uses as a target either silicon, or a material with silicon as its major component, to form a semiconductor film through RF power.

In addition, in the first aspect, the element is characterized in that the insulating film is formed by the sputtering method.

Further, the element is characterized in that the insulating film is either a single layer film or a laminated film of silicon nitride, oxidized silicon nitride, or silicon oxide.

A second aspect of the present invention is a semiconductor device which includes a semiconductor circuit made from a semiconductor element comprising an active layer formed by sputtering on the surface of an insulator, a gate insulating film in contact with the active layer, and gate wiring in contact with the gate insulating film, the element characterized in that the active layer has at least a channel formation region, with a source region and drain region formed on both sides of the channel formation region.

A third aspect of the present invention is a semiconductor device which includes a semiconductor circuit made from a semiconductor element having gate wiring on the surface of an insulator, a gate insulating film in contact with the gate wiring, and an active layer, formed by sputtering, in contact with the gate insulating film, the element characterized in that the active layer has at least a channel formation region, with a source region and drain region formed on both sides of the channel formation region.

Additionally, the second aspect and the third aspect of the present invention are both characterized in that at least the source region and the drain region include a catalytic element that promotes the crystallization of silicon.

Further, the above aspects are characterized in that the catalytic element includes one element, or plurality of elements selected from a group consisting of Ni, Fe, Co, Pt, Cu, Au, Ge, and Pb.

Note that the term amorphous semiconductor film is used throughout the specification to refer to a semiconductor film including amorphous materials. For example, an amorphous semiconductor film with micro-crystals such as a Si film, a Ge film, or a compound semiconductor film (for example, an amorphous silicon germanium film expressed as $Si_xGe_{1-x}$ where $0<x<1$).

Further note that the term crystalline semiconductor film is used throughout the specification to refer to either a single crystal semiconductor film, or to a semiconductor film that includes grain boundaries (a polycrystalline semiconductor film or a micro-crystalline semiconductor film), and is clearly differentiated from an amorphous semiconductor film in that the latter has a non-crystalline state over the entire film area. Of course, when only semiconductor film is used throughout the specification, the term refers to crystalline semiconductor films as well as non-crystalline semiconductor films.

In addition, the term semiconductor element is used throughout the specification to refer to switching elements and memory elements, for example thin film transistors (TFT) and thin film diodes (TFD).

A first aspect of the manufacturing method of the present invention is a method for manufacturing a semiconductor device which includes a semiconductor circuit made from a semiconductor element, and is characterized by comprising the steps of forming a semiconductor film by sputtering on top of the surface of an insulator, and forming a crystalline semiconductor film by crystallizing the sputtered semiconductor film.

A second aspect of the manufacturing method of the present invention is a method for manufacturing a semiconductor device which includes a semiconductor circuit made from a semiconductor element, and is characterized by comprising the steps of forming a semiconductor film by sputtering on top of the surface of an insulator, adding catalytic elements into at least a portion of the semiconductor film to promote crystallization, and forming a crystalline semiconductor film by crystallizing the semiconductor film.

A third aspect of the manufacturing method of the present invention is a method for manufacturing a semiconductor device which includes a semiconductor circuit made from a semiconductor element, and is characterized by comprising the steps of forming a semiconductor film by sputtering on top of the surface of an insulator, adding catalytic elements into at least a portion of the semiconductor film to promote crystallization, forming a crystalline semiconductor film by crystallizing the semiconductor film, and reducing the concentration of the catalytic elements throughout the crystalline semiconductor film.

A fourth aspect of the manufacturing method of the present invention is a method for manufacturing a semiconductor device which includes a semiconductor circuit made from a semiconductor element, and is characterized by comprising the steps of forming a semiconductor film by sputtering on top of the surface of an insulator, forming an insulating film in contact with the semiconductor film, and forming a crystalline semiconductor film by crystallizing the semiconductor film while it is in contact with the insulating film.

A fifth aspect of the manufacturing method of the present invention is a method for manufacturing a semiconductor device which includes a semiconductor circuit made from a semiconductor element, and is characterized by comprising the steps of doping catalytic elements over at least a portion of the surface of an insulator to promote crystallization, forming a semiconductor film by sputtering, forming an insulating film in contact with the semiconductor film, and forming a crystalline semiconductor film by crystallizing the semiconductor film while it is in contact with the insulating film.

A sixth aspect of the manufacturing method of the present invention is a method for manufacturing a semiconductor device which includes a semiconductor circuit made from a semiconductor element, and is characterized by comprising the steps of adding catalytic elements into at least a portion of the surface of an insulator to promote crystallization, forming a semiconductor film by sputtering, forming an insulating film in contact with the semiconductor film, forming a crystalline semiconductor film by crystallizing the semiconductor film while it is contact with the insulating film, and reducing the concentration of the catalytic elements throughout the crystalline semiconductor film.

BRIEF DESCRIPTION OF THE DRAWINGS

FIGS. 4A, 4B, and 4C are drawings showing an example of the manufacturing process according to Embodiment 1 of the present invention;

FIGS. 5A and 5B are drawings showing an example of the manufacturing process according to Embodiment 1 of the present invention;

FIGS. 11A, 11B, and 11C are drawings showing an example of the manufacturing process according to Embodiment 6 of the present invention;

DETAILED DESCRIPTION OF THE PREFERRED EMBODIMENTS

Embodiments of the present invention will be described below with reference to FIGS. 2A to 2C.

First, a substrate 100 is prepared. Glass, quartz, crystallized glass and other insulators, ceramics, stainless steel and other metals (tantalum, tungsten, molybdenum, etc.), semiconductors, plastics (polyethylene-terephthalate), etc., can be used as the substrate 100.

Next, an insulating base film 101 (referred to as base film throughout the rest of the specification) is formed on top of the substrate 100. Silicon oxide, silicon nitride, silicon nitride oxide ($SiO_xN_y$), or a laminate of more than one may be used as the base film 101, with a thickness in the range 100 to 500 nm. Sputtering is a recommended means for forming the base film due to its good safety and productivity. However, other methods such as thermal CVD, plasma CVD, evaporation, low pressure thermal CVD, etc. may also be employed. The base film has the effect of preventing diffusion of impurities from the substrate. Note that the base film is only intended to improve the electrical characteristics of the TFT, and need not be included.

Figure 2A:
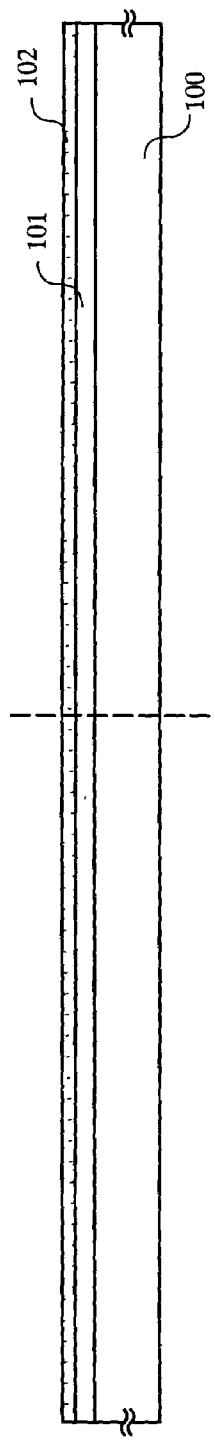
FIGS. 2A, 2B, and 2C are drawings showing an example of a manufacturing process according to Embodiment 1 of the present invention.

Next, a semiconductor film 102 is formed on top of the base film 101 by sputtering, as shown in FIG. 2A. The semiconductor film 102 can be a film made from amorphous silicon, an amorphous semiconductor containing microcrystals, a micro-crystalline semiconductor, amorphous germanium, amorphous silicon germanium of the form $Si_xGe_{1-x}$, where $0<x<1$, or from a laminate of more than one of the above, with a thickness in the range of 20 to 70 nm (typically 40 to 50 nm).

The sputtering apparatus used in the embodiments of the present invention basically consists of chambers, an evacuation system for creating a vacuum in the chambers, a gas input system for introducing the gas used during sputtering to the chambers, an electrode system with targets, RF electrodes, etc., and a sputtering power source connected to the electrode system.

Silicon, or a material with silicon as its major component, is used as a target. In addition, it is desirable that the target be strongly orientated to a surface providing a crystal face orientation of the silicon film ((100), (111), (110), etc.) A thin film with almost the same composition as the target is formed when sputtering, so sputtering has the merit of allowing one to be able to form a thin film with desired composition by regulating the composition of the target. In addition, the film growth rate is almost proportional to the sputtering voltage, and is stable.

Further, inert element gasses such as Ar, He, Ne, N, etc. are used either singly or in combination as the sputtering gas. In addition, hydrogen gas, etc., may be added in order to regulate the hydrogen concentration in the semiconductor film.

Note that in the present invention, the semiconductor film 102 is formed by evacuating the sputtering chamber to form a high vacuum (equal to or less than $1\times10^{-4}$ Pa), introducing the sputtering gas into the chamber, setting the deposition pressure to between 0.2 and 0.6 Pa, setting the temperature of the substrate to between 100 and 400° C., and setting the RF power to between 200 and 2500 W (per unit target area, between 1 and 15 W/cm$^2$). Also note that the sputtering conditions (sputtering gas, gas flow rate, deposition pressure, substrate temperature, deposition power, etc.) may be determined by considering the size of the target, the dimensions of the substrate, the film thickness of the semiconductor film, the quality of the semiconductor film, etc.) In addition, a power supply with a frequency of 13.56 MHZ and an impedance of 50 Ω is generally used, but if its frequency is high enough to generate a plasma, there are no specific limitations on the voltage supply specifications. It is also possible to substitute a DC power for the RF power.

In the sputtering method, the ions inside a plasma are accelerated, causing a sputter when the ions impact the target. The atoms that are dislodged from the target by the ion impacts then adhere to the substrate, forming a thin film. The chief way to perform sputtering is by using a target that includes as the constituent elements the atoms that need to be included in the film to be formed (co-sputtering method), but other methods exist, such as reactive sputtering in which a reactive gas (for example, oxygen, ammonia, etc.) is introduced during the process of sputtering the target.

Note that it is desirable that a cleaning process, such as plasma etching, be carried out on the surface of the substrate before forming a film using sputtering.

In addition, the base film and the semiconductor film may be formed in succession, without exposing the substrate and films to the atmosphere. A film deposition apparatus is shown in FIGS. 17A and 17B, and may be used to form films in succession.

Figure 17A:
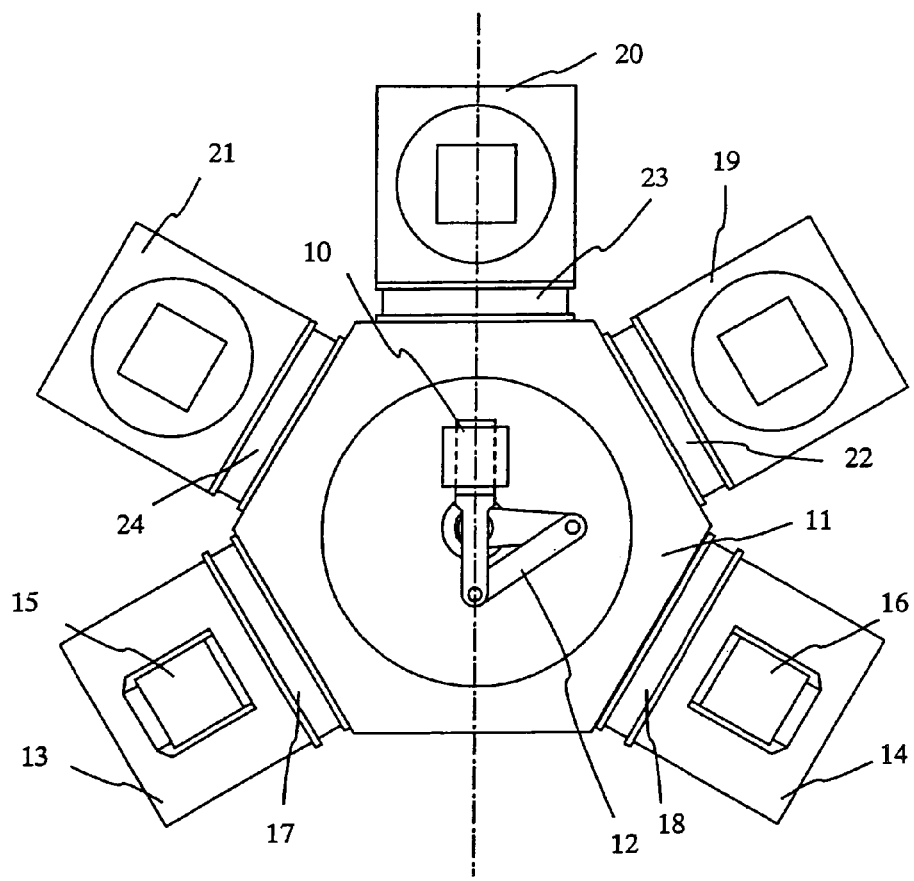
FIGS. 17A and 17B are drawings showing an example of a device according to Embodiment 9 of the present invention.
Figure 17B:
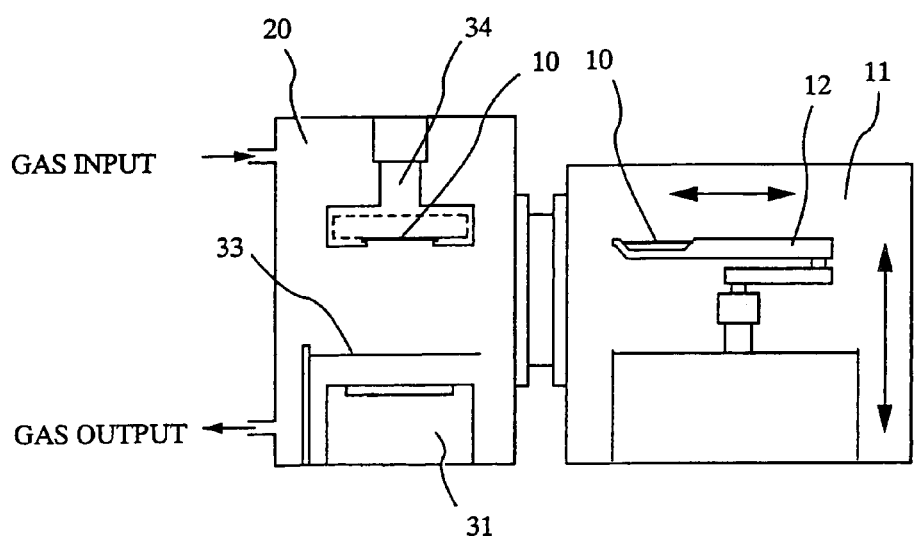

The multi-chamber film deposition apparatus shown in FIGS. 17A and 17B is an example of a sputtering apparatus in which each of the reaction chambers (chambers) is provided with a target of differing composition (or of different elements), allowing a multiple number of films with differing composition to be-laminated in succession.

An explanation of the simple structure of the sputtering apparatus shown in FIGS. 17A and 17B follows here. FIG. 17B is a schematic diagram of the cross-section of the apparatus shown in FIG. 17A, along the dashed line. FIG. 17A shows three chambers, but the actual number of chambers employed may be increased or decreased depending on the requirements of the work to be performed. A substrate 10 to be processed, a common chamber 11, a conveyer mechanism 12 for conveying the substrate 10 to be processed from one location to another, a target support platform 31, a shutter 33, and a substrate holder 34 are shown. The substrate is taken into and brought out from load lock chambers 13 and 14 fixed to the main body of the apparatus. Note that substrate conveyor cassettes 15 and 16 are set, respectively, in the load lock chambers 13 and 14. In addition, gate valves 17 and 18 allow an airtight seal to be made between the load lock chambers 13 and 14, and the common chamber 11. Further, chambers 19, 20, and 21 are connected to the common chamber 11, and gate valves 22, 23, and 24 are connected to each chamber, respectively, in order to form an airtight seal with the common chamber. Chambers 19, 20, and 21 are each outfitted with a low pressure vacuum pump that is capable of producing an extremely high vacuum ($1\times10^{-8}$ torr or less, preferably $1\times10^{-9}$ torr or less). By using this type of apparatus, it is possible to successively form films by lamination without exposure to the atmosphere.

Successive formation of films in the present specification indicates that films are formed one after another while at high vacuum, without exposure to the atmosphere. For example, this may be accomplished by moving the substrate between different chambers while remaining under a high vacuum, or successive films may be formed inside one chamber, all the while under high vacuum, with no exposure to the atmosphere in either case.

Using this type of process leads to a clean interface between the base film and the semiconductor film.

Compared to the plasma CVD process that has been used in the past, with the sputtering method of the present invention, described above, the adhesion to the base film and the substrate is high, and a semiconductor film with a desired film quality (density of hydrogen, oxygen, and other impurities in the film) can be formed.

Figure 2B:

Next the semiconductor film 102 is put through a crystallization process, resulting in a crystallized semiconductor 103, as shown in FIG. 2B.

The film obtained using the sputtering method of the present invention is a starting point, and the film that is then obtained after the crystallization process differs from previous crystalline semiconductor films. The current invention produces a crystalline semiconductor film in which a columnar structure can be observed.

The crystallization process in the present invention can be accomplished by using any of several well-known means. For example, crystallization by either infrared or ultraviolet irradiation (laser crystallization), laser crystallization using a catalytic element, thermal crystallization, thermal crystallization using a catalytic element, etc. are all processes that may be used either singly or in combination.

The stresses induced on the substrate are especially small with laser crystallization, and the process can be carried out in a short amount of time, making it an effective process. For ultraviolet laser crystallization, either an excimer laser beam or the strong light rays emitted by an ultraviolet lamp may be employed. Infrared light crystallization may be performed similarly using either an infrared laser beam, or the strong light rays emitted by an infrared lamp. Note that pulse lasers using XeCl, ArF, KrF, and other gasses, or continuous-wave lasers such as Ar laser can be employed, with a linear shaped laser beam (several millimeters by several centimeters), or a laser beam either rectangular or square.

Note that the specific conditions used during laser crystallization (laser beam shape, laser wavelength, overlap ratio, irradiation strength, pulse width, repeating frequency, irradiation time, etc.) can be set by the operator depending on the thickness of the semiconductor film, the substrate temperature, etc. Further, depending upon the conditions selected for the laser crystallization process, the semiconductor film may pass into a melted state before crystallization, or may remain in a solid state, or pass into an intermediate state between the solid and liquid states to be crystallized. However, if the laser crystallization is carried out under exposure to the atmosphere, a thin oxide layer is formed and there are cases in which it should be removed in a later process. It is also possible to perform the laser crystallization process on the semiconductor film inside the same chamber in which the sputtering process takes place, without all exposure to the atmosphere.

A thermal crystallization process which uses a doped catalytic element (nickel) to promote crystallization is discussed in detail in Japanese Patent Application Laid-open No. Hei 7-130652 and in Japanese Patent Application Laid-open No. Hei 9-312260. Metal elements that promote crystallization include Fe, Co, Ni, Ru, Rh, Pd, Os, Ir, Pt, Cu, and Au, which may be used either singly or in combination. In addition, substitution diffused Ge and Pb that are diffused throughout the amorphous silicon film may also be used.

However, laser crystallization processes and thermal crystallization processes that employ a catalytic element leave a high concentration of the catalyst remaining within the semiconductor film, so a reduction process such as gettering should be used after crystallization to reduce the catalytic element concentration in the semiconductor film.

Figure 2C:
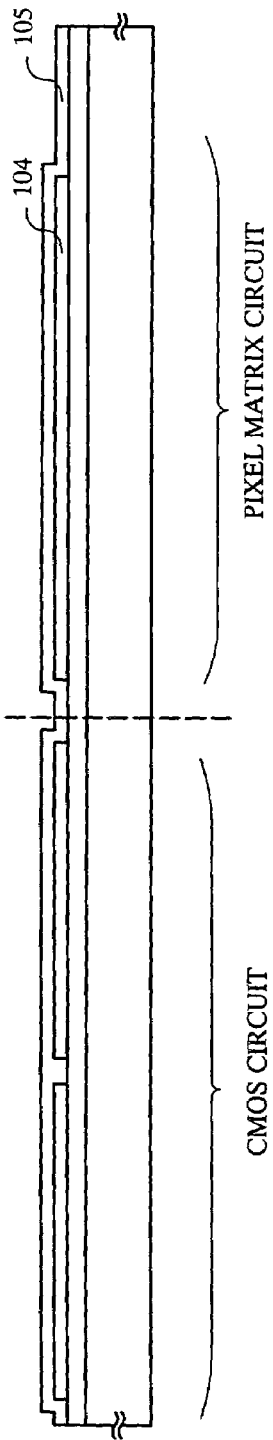

Next, the crystallized semiconductor film 103 is patterned, forming an active layer 104 into a desired shape, as shown in FIG. 2C. The active layer 104 is then covered by forming an insulating film 105 (which will become a gate insulating film after further processing).

A silicon oxide film, silicon nitride film, silicon nitride oxide ($SiO_xN_y$) film, or an organic resin film such as benzocyclobutene (BCB) film may be used either singly or in a laminate of more than one as the insulating film 105. Well-known processes such as thermal CVD, plasma CVD, low pressure thermal CVD, sputtering, evaporation, and coating may be used as the means to form the insulating film, which should have a film thickness in the range of 10 to 300 nm.

In the scope of the present invention, the sputtering method is desirable to form the semiconductor film 102 and the insulating film 105, based on a safe work environment. A silicon oxide target, or a target that is comprised of a material with silicon oxide as its primary component, is used in the sputtering method. Also, inert gasses such as Ar, He, Ne, N, etc. are used either singly or in a combination of more than one as the sputtering gas. In addition, it is desirable to add gaseous oxygen to control the quality of the film. The specific sputtering conditions (sputtering gas, gas flow rate, deposition pressure, substrate temperature, power strength, etc.) may be set by the operator after taking into consideration the size of the target, the dimensions of the substrate, the film thickness of the insulating film 105, the quality of the insulating film 105, etc.

Note that the order of the manufacturing processes described above may be set by the operator depending on the type of elements to be manufactured. For example, to manufacture a bottom gate TFT, after making the base film the gate wiring is formed, next the insulating film (gate insulating film) is formed, and then the semiconductor film of the present invention (by sputtering) is laminated on top. In addition, a process where the crystalline semiconductor film 103 is formed, then the insulating film 105 is laminated, and the patterning of the crystalline semiconductor film 103 occurs after the formation of the insulating film 105, may be employed.

It is possible to apply the active layer 104 or the insulating film 105, formed by the above manufacturing methods, to more than just simple elements like thin film transistors (TFTs) and MOS transistors. It can be applied also to semiconductor devices such as display devices and image sensors, etc., which contain semiconductor circuits comprised of these insulated gate transistors.

Instead of the process described above, it is also possible to take a process of forming a semiconductor film 1150 by the sputtering method, then forming an insulating film 1151, successively, followed by crystallizing the semiconductor film through the insulating film. This gives a crystalline semiconductor film 1152, as in the example shown in FIGS. 10A to 13B. The deposition apparatus shown in FIGS. 17A and 17B may be used for the successive formation of the insulating film 1151. The apparatus may also be used to form the semiconductor film 1150 by sputtering, to form the insulating layer 1151 by sputtering, and to perform laser crystallization on the semiconductor film 1150, all within the same chamber, without exposure to the atmosphere. In addition, a silicon oxide film, silicon nitride film, or silicon nitride oxide ($SiO_xN_y$) film, either singly or in a laminate of more than one, may be used as the insulating film 1151. Well-known processes such as thermal CVD, plasma CVD, low pressure thermal CVD, sputtering and evaporation can be used to form the insulating film 1151, with a film thickness in the area of 1 to 50 nm. Thus, by successively forming the insulating film 1151 after forming the semiconductor film 1150, without exposure to the atmosphere, good interface characteristics between films can be obtained.

Instead of the above process, it is possible to take a process where an insulating film is formed on top of a crystalline semiconductor film, where the crystalline semiconductor film undergoes patterning after formation of the insulating film.

The following description of preferred embodiments is given for illustrative purposes only and is not to be construed as imposing any limitations on the scope of the present invention.

EMBODIMENT 1

In this embodiment, a description will be made on an example in which a CMOS circuit, that is a part of a peripheral drive circuit, and a pixel TFT, that is a part of a pixel matrix circuit, are formed on the single same substrate using the present invention. The semiconductor device and its manufacturing method will be described briefly with reference to the simple cross sectional drawings shown in FIGS. 1 to 6B.

First the substrate 100 is prepared. In this embodiment, a glass substrate (Corning 1737, distortion point 667° C.) is used. Next, after a base insulating film (hereinafter in this specification, referred to as base film) is formed on top of the substrate 100, it is annealed. The heat treatment here is performed below the distortion point of the substrate, preferably between 200 and 700° C. In Embodiment 1, TEOS and oxygen ($O_2$) are used as raw material gasses in a plasma CVD apparatus in order to form a 200 nm thick silicon oxide film as the base film 101, which is then annealed at 640° C. for 4 hours.

The semiconductor film 102 is then formed on top of the base film 101 by sputtering, as FIG. 2A shows. Silicon is used as the target (6 φ) and Ar gas (gas flow rate 20 to 50 sccm) is used as the sputtering gas for Embodiment 1. In addition, either hydrogen gas or helium gas may be added (gas flow rate 1 to 50 sccm) to regulate the hydrogen density in the semiconductor film.

After the state shown in FIG. 2A is reached, crystallization of the semiconductor film 102 is performed, forming the crystalline semiconductor film 103, a crystalline silicon film. Laser crystallization of the semiconductor film 102 is employed in Embodiment 1. In this embodiment, XeCl excimer laser light is formed into a linear (0.4 mm×length 135 mm) beam and irradiated, under atmospheric conditions (FIG. 2B). The laser beam has a 30 Hz pulse frequency, an overlap ratio of 96%, and a laser energy density of 359 $mJ/cm^2$. Note that due to the laser being used in the atmosphere, a thin oxidation layer is formed on the surface, but it is not shown in FIG. 2B in order to simplify the explanation of Embodiment 1.

After the processing in FIG. 2B is completed, it is acceptable to add impurities in order to control the threshold value, and it is also acceptable to add impurities in a region to be the channel formation region.

The crystalline semiconductor film 103 is patterned next, forming the active layer 104 in a desired shape. The active layer 104 is then covered by forming the insulating film 105 (which will become a gate insulating film after further processing), a silicon oxide film 150 nm in thickness deposited by sputtering (FIG. 2C).

A conductive film (material layer for gate wiring) is then formed on top of the insulating film 105.

Further, either conductor or semiconductor materials may be used for the conductive film. For example, usable as the conductive film is a single layer containing as the main constituent aluminum (Al), tantalum (Ta), copper (Cu), niobium (Nb), hafnium (Hf), zirconium (Zr), titanium (Ti), chromium (Cr), silicon (Si) or silicide, or multi-layers thereof. A film thickness of 10 to 500 nm can be used for the conductive film. A 400 nm aluminum film is deposited as the conductive film for Embodiment 1.

Figure 3A:
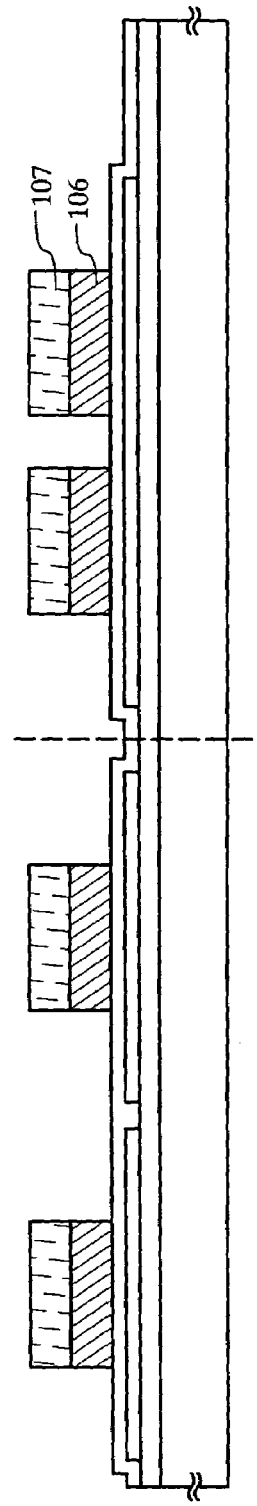
FIGS. 3A, 3B, and 3C are drawings showing an example of the manufacturing process according to Embodiment 1 of the present invention.

The conductive film is then patterned using a mask 107, and the material layer 106 that will form the gate wiring is formed, as shown in FIG. 3A.

Figure 3B:
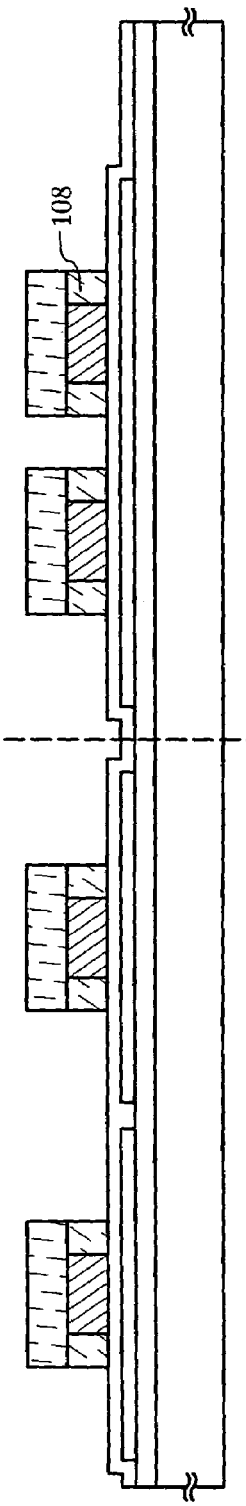
Figure 3C:
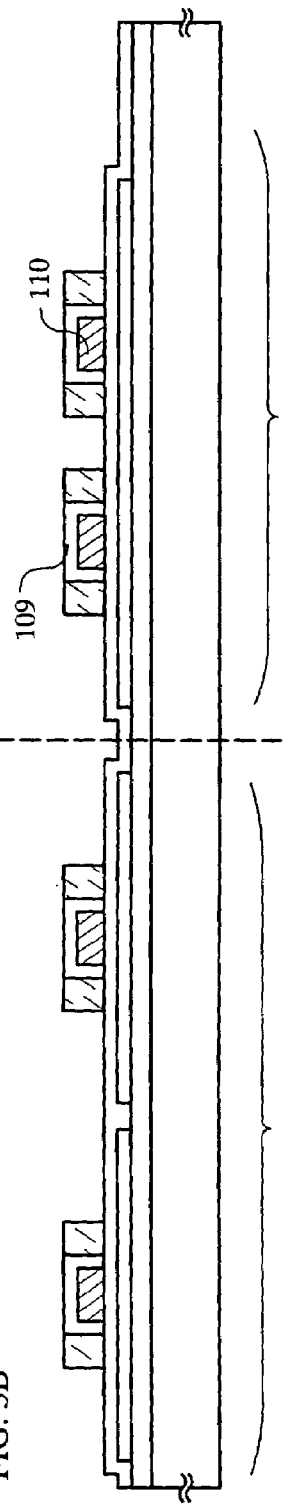

A first anodic oxidation is performed on the material layer 106 that will form the gate wiring, forming an anodic oxidation film 108 that is porous, as shown in FIG. 3B. Additionally, after removal of the mask 107, a second anodic oxidation is performed, forming a fine anodic oxidation film 109, and then forming a gate wiring 110, as shown in FIG. 3C. Next, the gate wiring 110, and anodic oxidation films 108 and 109 are used as a mask to pattern the insulating film 105, forming a gate insulating layer 111, as shown in FIG. 4A. The porous anodic oxidation film 108 is then removed, as shown in FIG. 4B. Alternatively, an insulating film covering the gate wiring, which is a protective film to protect the gate wiring, may be formed without performing the anodic oxidation above.

The insulating film 105 may not be patterned in FIG. 4A, but it may be patterned after adding impurities in the active layer through the insulating film 105.

Next, the n-channel TFT is covered with a mask 201, and impurities are doped in the active layer 104 to give it p-type conductivity using as a mask the gate wiring 110. In addition, it is possible to form a mask that will allow for the selective adding of impurities to a preset area of the active layer 104. Ion implantation, plasma doping, laser doping, and other well-known methods may be used as a means for adding impurities. However, the dose, the acceleration voltage, and other doping conditions are regulated in order to ensure that the impurities are doped to specific locations of the active layer in the preset amount. Boron is used as an impurity to provide p-type conductivity in Embodiment 1. After the impurity adding process described above is carried out, heavy impurity regions (p$^+$-type regions) 112 and 113 act as source and drain regions, while light impurity regions (p$^-$-type regions) 114 and 115 act as LDD regions. The region 116 that serves as an intrinsic, or essentially intrinsic, channel formation region is also shown in FIG. 4C. The mask 201 is then removed.

Next, the p-channel TFT is covered with a mask 202, and impurities are added to the active layer to impart n-type conductivity. Phosphorous is used as an impurity to provide n-type conductivity in Embodiment 1. After the impurity adding process described above is carried out, heavy impurity regions (n$^+$-type regions) 117 and 118 act as source and drain regions, while those light impurity regions (n$^-$-type regions) 119 and 120 act as LDD regions. Further, regions not implanted with either phosphorous or boron ions become an intrinsic, or essentially intrinsic, channel formation region 121, used to route the carrier, as shown in FIG. 5A. Thereafter, the mask 22 is removed.

Note that the term intrinsic is used throughout the specification to refer to a region in which no impurities is included to change the Fermi level of silicon. In addition, the term essentially intrinsic is used to refer to a region in which the number of electrons and poles is perfectly balanced, a region that counteracts conductivity. In other words, essentially intrinsic refers to a region containing impurities, that give either a p-type or n-type conductivity, with a controllable threshold value range of concentration ($1\times10^{15}$ to $1\times10^{17}$ atoms/cm$^3$ when analyzed by SIMS). Or it refers to a region in which impurities that exhibit reverse conductivity are intentionally added in order to counteract the conductivity.

Next, a well-known process such as thermal annealing or laser annealing is carried out in order to obtain an activation effect of the impurities in the source and drain regions, and to get a restorative effect for any damage to the active layer crystal structure that was caused during the doping process. In Embodiment 1, after irradiation by laser light with a pulse frequency of 50 Hz, and a laser energy density of 179 mJ/cm$^2$, thermal activation is performed (in a nitrogen atmosphere, 405° C., 2 hours.)

Afterward, it is also acceptable to form a passivation film by covering with oxidized silicon nitride film, silicon nitride film, etc., in order to protect the work.

Next, as shown in FIG. 5B, a first interlayer insulating film 122, a silicon nitride oxide film (SiO$_x$N$_y$) in the Embodiment, is formed, and then after contact holes are formed to expose the source and drain regions, a metallic film is formed. This is patterned, forming metallic wirings 123 to 127 that provide contact with the source and drain regions. Finally, a hydrogenation process is performed (hydrogen atmosphere, 350° C., 2 hours.)

The n-channel TFT and p-channel TFT are manufactured by performing these processes.

Next, a second interlayer insulating film 128 is formed by spin coating an acrylic resin film to a thickness of 1 µm. The second interlayer insulating film 128 is then etched, and after contact holes are formed, a 300 nm Ti metallic film is deposited. After then patterning the metallic film, a black mask 131 and lead wires 129 and 130 are formed.

Further, a third interlayer insulating film 132 is formed by an acrylic resin. In Embodiment 1 the third interlayer insulating film 132 is formed by spin coating to a thickness of 1 µm.

A contact hole is then formed, and a pixel electrode 133 is formed. In Embodiment 1, first a transparent conductive film, for example, an ITO film is sputtered to a thickness of 100 nm, and then it is patterned, forming the pixel electrode 133. As a pixel electrode, a compound comprising indium oxide and zinc oxide can be also employed instead of ITO. Finally, this is treated with heat for 1 hour at 350° C. in a hydrogen atmosphere, reducing defects throughout the semiconductor layers. The conditions shown in FIG. 1 are thus obtained.

Figure 1:
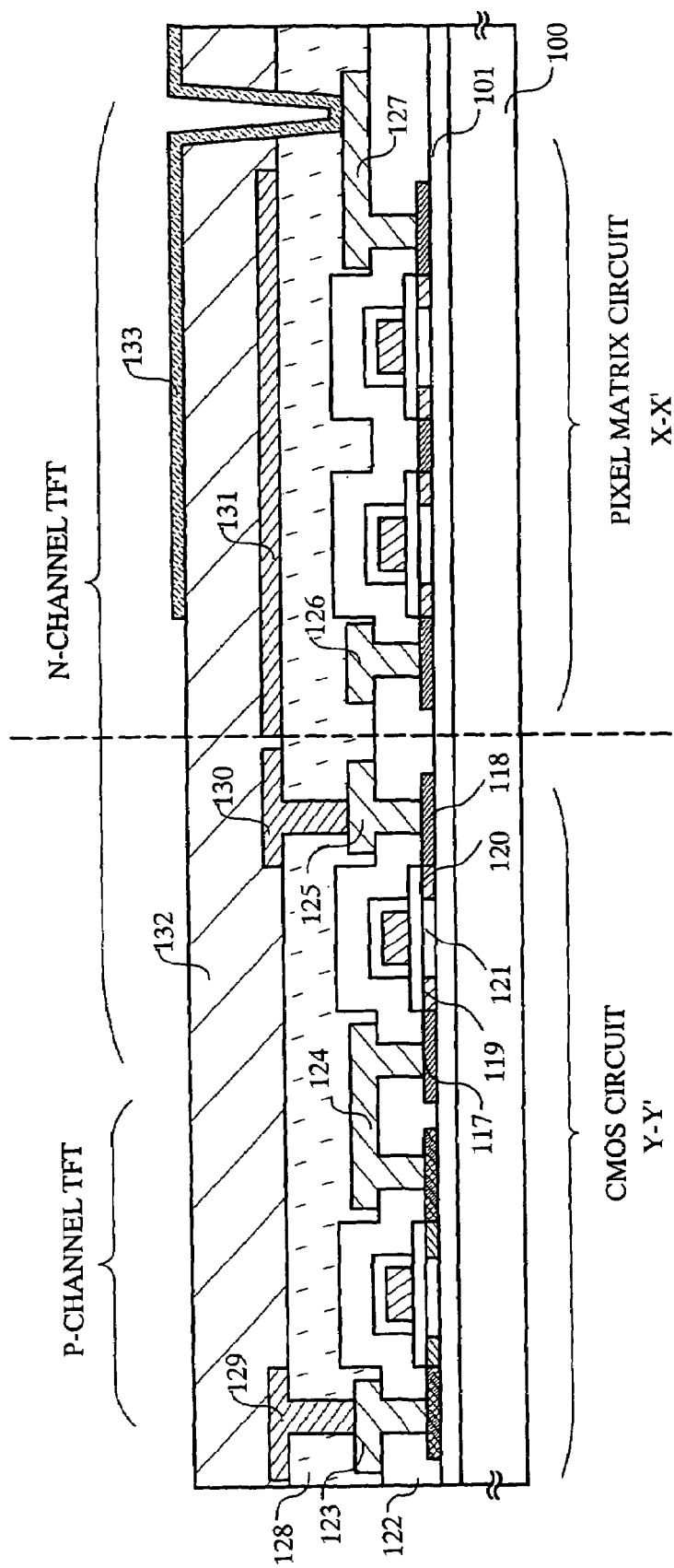
FIG. 1 is a drawing showing an example of the structure according to Embodiment 1 of the present invention.

Although used for the explanation in FIG. 1 is a double gate structure pixel matrix TFT, the present invention may also be applied to single gate, triple gate, and other multiple gate structures.

Figure 6A:
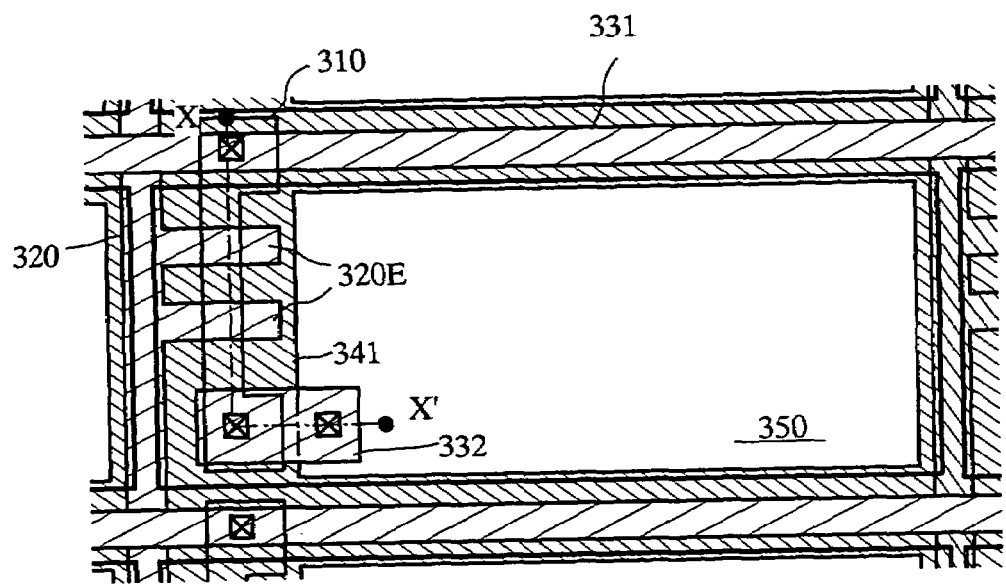
FIGS. 6A and 6B are drawings showing top views of the structure according to Embodiment 1 of the present invention.
Figure 6B:
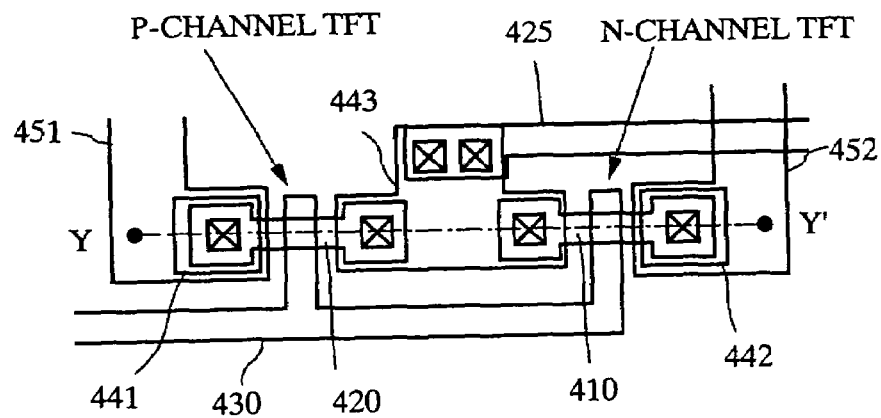

FIGS. 6A and 6B are equivalent to top views of the drawing shown in FIG. 1. The dotted line X–X' represents the cross sectional view of the pixel matrix circuit construction in FIG. 1, while the dotted line Y–Y' represents the cross sectional view of the CMOS circuit construction in FIG. 1. An active layer 310, a scanning line 320, a gate wiring 320E, a signal line 331, a drain electrode 332, a black mask 341, and a pixel electrode 350 are all shown in FIG. 6A. In FIG. 6B, active layers 410 and 420, gate wirings 425 and 430, source electrodes 441 and 442, a drain electrode 443, a drain wiring 451, and a source wiring 452 are shown.

The TFT structure shown in Embodiment 1 is an example of a top gate type, and places no special limitations on the structure of Embodiment 1. In addition, Embodiment 1 shows the manufacture of a transmissive LCD, which is just one example of a semiconductor device. Note that by suitably constructing the pixel electrode from a highly reflective metal film, instead of ITO, and then changing the patterning of the pixel electrode, the operator can easily manufacture a reflective LCD. In addition, by using as a base film a structure consisting of a heat resistant metal film and an insulating film layered thereon, or a structure consisting of an insulating film formed on top of aluminum nitride during manufacture of the reflective LCD, the metallic film underneath the insulating film will work effectively as a heat radiation layer. Also note that operators may suitably change the order of the above processes as needed.

EMBODIMENT 2

This embodiment takes an example in which a process that differs from that of Embodiment 1 is used to obtain a crystalline semiconductor film. In Embodiment 2 an additional process is performed before or after formation of the semiconductor film of Embodiment 1, which places a catalytic element either selectively or over the entire semiconductor surface, in order to promote crystallization. The basic structure of Embodiment 2 is similar to that of Embodiment 1, therefore the focus of the description will be on the differences only.

Embodiment 2 is the same as Embodiment 1 through the process of forming the semiconductor film by sputtering.

A catalytic element to promote silicon crystallization is introduced into the semiconductor film surface in Embodiment 2. Elements Ni, Fe, Co, Pt, Cu, Au, and Ge may be used either singly, or in combination, as the catalyst for promoting silicon crystallization. Ni was chosen for Embodiment 2 due to its quick diffusion speed throughout the amorphous silicon film, and the extremely good quality crystal obtained.

In addition, there are no special limitations on what location the above catalytic element may be introduced. It is added either over the entire amorphous silicon surface, or added to selective areas through use of a suitable mask. In addition, the catalytic element may be introduced on the bottom surface of the amorphous silicon film, or even on both the bottom and top surfaces.

Further, there are no special limitations on what type of processing method is used to introduce the catalytic element to the amorphous silicon film, provided that the process is able to hold the catalytic elements in contact with the surface of the amorphous silicon film, or is able to place them within the amorphous silicon film itself. For example, sputtering, CVD, plasma processing, adsorption, ion implantation, and coating of a solution that contains the catalytic elements can be used. From this group, the process using a solution is useful in that it is easy to perform, and it is simple to regulate the catalytic element concentration. Several types of metallic salts can be used, with solvents ranging from water to alcohols, aldehydes, ethers, and other organic solvents. Mixtures of organic solvents and water may also be used. A coating method is employed in Embodiment 2. A solution containing between 1 to 1000 ppm nickel (per weight), with a value of between 10 and 100 ppm desirable, is coated. However, depending on the thickness of the amorphous silicon film, it may be necessary to adjust the concentration by adding a suitable amount of catalyst. An amorphous silicon film processed in this manner has a nickel concentration of between $1 \times 10^{19}$ and $1 \times 10^{21}$ atoms/cm$^3$.

After introducing catalytic elements into the amorphous silicon film as described above, crystallization is performed by laser light irradiation in order to obtain a crystallized silicon film. In addition, a high temperature heating process may be substituted for laser irradiation. Further, a gettering process may be added after crystallization in order to reduce the concentration of the catalyst in the film.

If further processing is performed according to Embodiment 1, the semiconductor device of FIG. 1 can be obtained.

EMBODIMENT 3

This embodiment takes an example in which a process that differs from that of Embodiment 1 is used to obtain a crystalline semiconductor film. In Embodiment 1, after the heat treatment is given on the base film, a semiconductor film is formed by sputtering, but in Embodiment 3, the base film and the semiconductor film are formed in succession, without exposure to the atmosphere.

First, a plastic substrate is prepared. A silicon nitride film is formed on top of the substrate by sputtering to act as a base film, and an amorphous silicon film is laminated, also by sputtering, to act as a semiconductor film. The two films are formed in succession, without exposure to the atmosphere. It is possible to create a clean interface between the base film and the semiconductor film with this processing method.

Next, laser light irradiation is used to form a crystalline semiconductor film by crystallizing the amorphous silicon semiconductor film. Further, a gate insulating film may be formed successively by sputtering after the laser process is performed, all without exposure to the atmosphere, providing a clean interface between the semiconductor film and the gate insulating film.

If further processing is performed according to Embodiment 1, the semiconductor device of FIG. 1 can be obtained. In addition, a combination with Embodiment 2 is possible.

EMBODIMENT 4

A top gate type TFT is used for the explanation of Embodiment 1, however the present invention can also be applied to a bottom gate type TFT, such as an inverted stagger type TFT. In Embodiment 4 of the present invention, FIGS. 7A to 7G are used to explain the manufacture of a TFT (bottom gate type TFT) that differs from that of Embodiment 1.

Figure 7A:
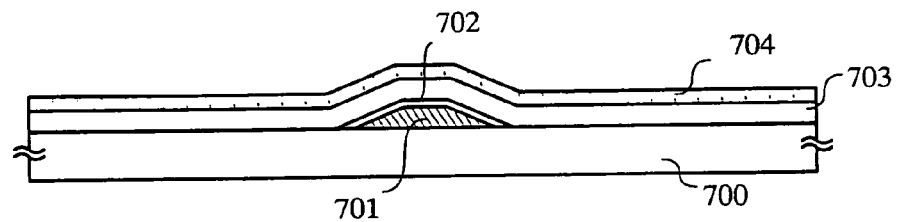
FIGS. 7A to 7G are drawings showing an example of a manufacturing process according to Embodiment 4 of the present invention.

A substrate 700, and a gate wiring 701, that is a laminate of tantalum (Ta) and tantalum nitride (TaN), are shown in FIG. 7A. To simplify the drawing, the laminate structure of the base film and gate wiring is not shown.

An anodic oxidation process is then performed, forming a protective film 702 on the surface of the gate wiring. It is possible to substitute a normal oxidation process for the anodic oxidation process for the oxidized film. Next, a gate insulating film 703 is formed on top of the gate wiring 701. A silicon oxide film formed by sputtering is used as the gate insulating film 703 in Embodiment 4 (FIG. 7A).

An amorphous silicon film 704 including microcrystalline is then formed by sputtering on top of the gate insulating film 703.

Figure 7B:
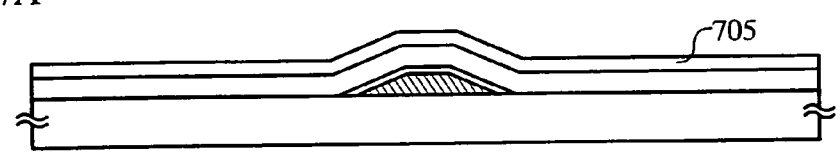

A crystallization process using laser light or heat is next carried out, forming a crystalline semiconductor film 705, as shown in FIG. 7B.

Figure 7C:
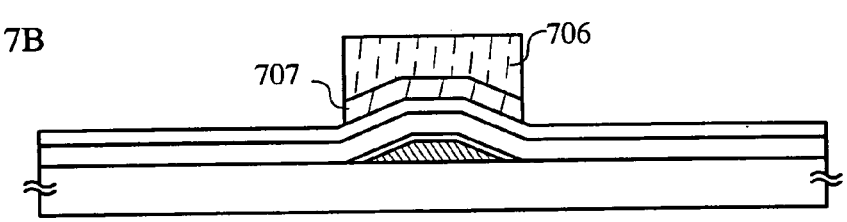

Further, a resist mask 706 is used to form a mask 707 made from a silicon oxide film, as shown in FIG. 7C.

Figure 7D:
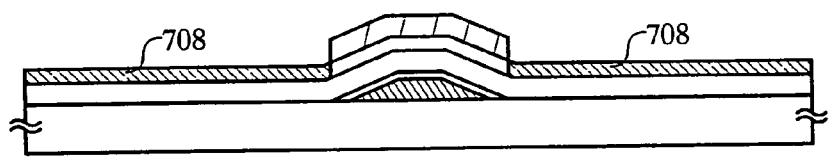

Impurities are then added after removing the resist mask 706, forming an impurity region 708, as shown in FIG. 7D.

Figure 7E:
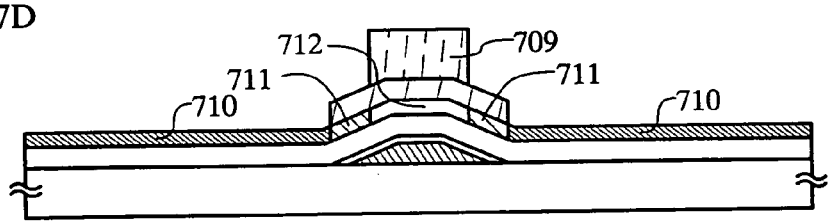

Next the area that will become the channel formation region is covered by a resist mask 709, and a low concentration of impurities is added. This forms a light impurity region 711, a channel formation region 712, and a heavy impurity region 710, as shown in FIG. 7E.

Figure 7F:
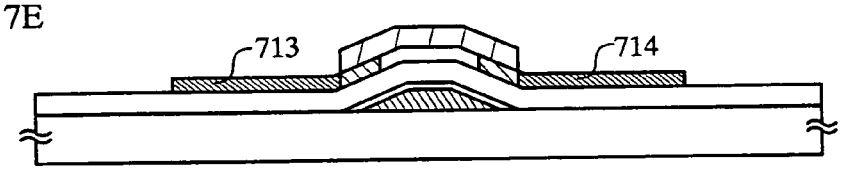

The active layer is patterned next, forming a source region 713 and a drain region 714, as shown in FIG. 7F.

Figure 7G:
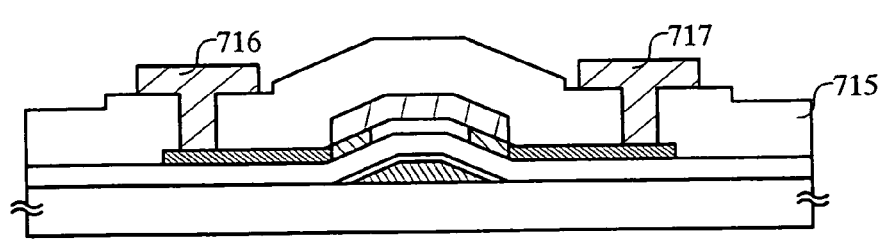

An interlayer insulating film 715 is then formed, as are wirings 716 and 717, as shown in FIG. 7G.

Note that Embodiment 4 only contains an explanation of a manufacturing process for a single inverted stagger type TFT, but there are no limitations provided that bottom gate type TFT is made. In addition, by referring to the manufacturing process outlined in Embodiment 1, it is simple to manufacture CMOS circuits and to form pixel matrix circuits using the inverted stagger type TFT of Embodiment 4. Further explanation has therefore been omitted.

EMBODIMENT 5

Figure 8:
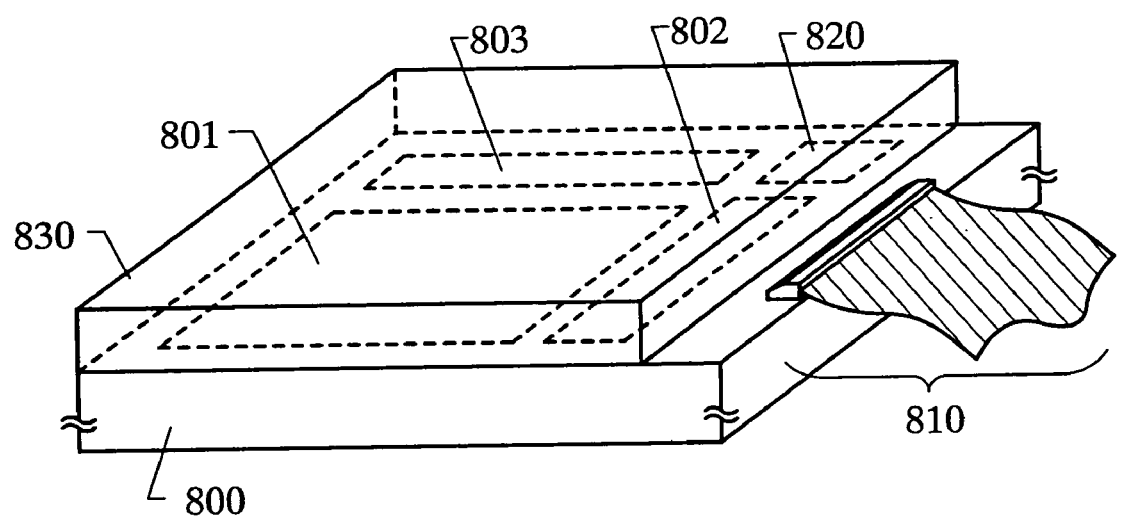
FIG. 8 shows an active matrix display device in Embodiment 5 of the present invention.

An example of a liquid crystal display device manufactured in accordance with the present invention is shown in FIG. 8. Any well-known means may be used to manufacture pixel TFTs (pixel switching elements) and group them into cells, so an explanation of these processes has been omitted.

A substrate 800 with an insulating surface (a glass substrate with a silicon oxide film), a pixel matrix circuit 801, a scanning line drive circuit 802, a signal line drive circuit 803, an opposing substrate 830, an FPC 810 (flexible printed circuit), and a logic circuit 820 are all shown in FIG. 8. It is possible to form the logic circuit 820 with a circuit that substitutes existing IC processes, such as those used to form a D/A converter, y correction circuit, a signal partitioning circuit, etc. It is of course also possible to put an IC chip on top of the substrate, and perform signal processing using the IC chip.

In addition, a liquid crystal display device is given as an example and explained in Embodiment 5, but it may of course be applied to any active matrix display device such as an EL (electro-luminescence) display device and an EC (electrochromics) display device.

In addition, the present invention may be used to manufacture either transmissive type or reflective type liquid crystal display devices. The operator is free to choose the type. The present invention is thus applicable to all active matrix type electro-optical devices (semiconductor devices.)

Note that it is possible to employ any of the previous structures of Embodiments 1 through 4, or to freely combine them, in order to manufacture the semiconductor devices shown in Embodiment 5.

EMBODIMENT 6

This embodiment describes another example in which a CMOS circuit, that is a part of a peripheral drive circuit, and a pixel TFT, that is a part of a pixel matrix circuit, are formed on the single same substrate. However, there is difference between this example and Embodiment 1. The semiconductor device and its manufacturing method will be described briefly with reference to the simple cross sectional drawings shown in FIGS. 9 to 14B.

First a substrate 1100 is prepared. In this embodiment, a glass substrate (Corning 1737, distortion point 667° C.) is used as the substrate 1100. Next, after a base insulating film 1110 (hereinafter in this specification, referred to as base film) is formed on top of the substrate 1100, it is annealed. The annealing process here is performed below the distortion point of the substrate, preferably between 200 and 700° C. In Embodiment 6, TEOS and oxygen ($O_2$) are used as raw material gasses in a plasma CVD apparatus in order to form a 200 nm thick silicon oxide film as the base film 1110, which is then annealed at 640° C. for 4 hours.

A semiconductor film 1150 is then formed on top of the base film 1101 by sputtering. Silicon is used as the target (6 φ) and Ar gas (gas flow rate 20 to 50 sccm) is used as the sputtering gas for Embodiment 6. In addition, either hydrogen gas or helium gas may be added (gas flow rate 1 to 50 sccm) to regulate the hydrogen density in the semiconductor film.

Figure 10A:
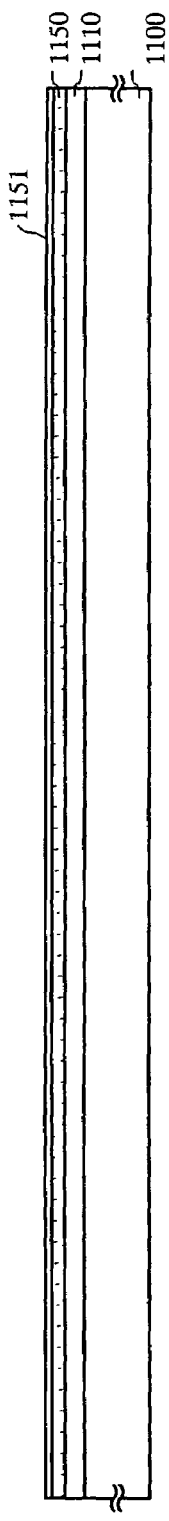
FIGS. 10A to 10D are drawings showing an example of a manufacturing process according to Embodiment 6 of the present invention.

Next, an insulating film 1151 is formed by successively sputtering a 20 nm silicon oxide film on top of the semiconductor film 1150, as shown in FIG. 10A. An artificial quartz target is employed in the sputtering process, with Ar gas used as the sputtering gas, and oxygen gas used as the reactive gas, in a ratio of $O_2$/Ar between 20 and 80%.

Figure 10B:

After the state shown in FIG. 10A is reached, crystallization of the semiconductor film 1150 is performed through the insulating film 1151, forming a crystalline semiconductor film 1152 made of a crystalline silicon film. Laser crystallization of the semiconductor film 1150 is employed in Embodiment 6. In this embodiment, Excimer laser light is formed into a linear (0.4 mm×length 135 mm) beam and irradiated, under atmospheric conditions (FIG. 10B). The laser beam has a 30 Hz pulse frequency, an overlap ratio of 96%, and a laser energy density of 175 mJ/$cm^2$. The surface of the semiconductor film 1150 will not become contaminated during laser crystallization processing because the insulating film 1151 has been formed on the surface of the semiconductor film 1150.

After the processing in FIG. 10B is completed, it is acceptable to add impurities in order to control the threshold value, and to add impurities in a region to be the channel formation region.

Figure 10C:
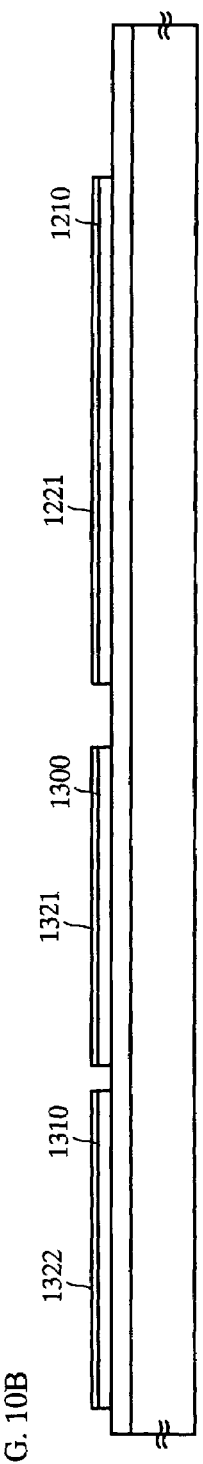

A crystalline semiconductor film 1152 thus obtained and the insulating film 1151 are patterned next, forming active layers 1210, 1300, and 1310, and insulating films 1221, 1321, and 1322 (which will become a portion of a gate insulating film after later processing), all in desired shapes, as shown in FIG. 10C.

Figure 10D:
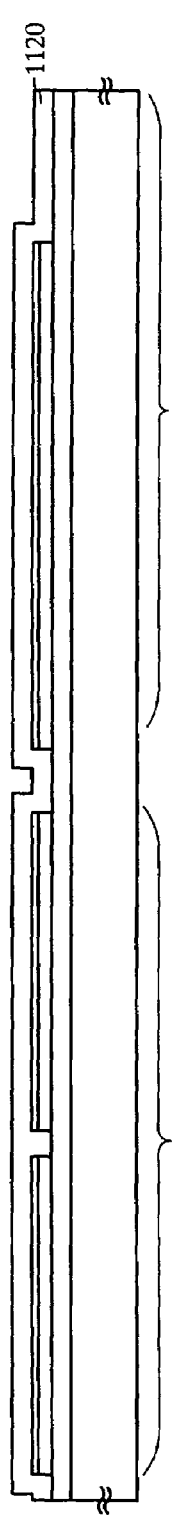

The active layers 1210, 1300, and 1310, as well as the insulating layers 1221, 1321, and 1322, are then covered to form as an insulating film 1120 (which will become a portion of the gate insulating film after further processing) a 150 nm thick silicon oxide film deposited by sputtering, as shown in FIG. 10D.

A conductive film (material layer for gate wiring) is then formed on top of the insulating film 1120.

Further, either conductor or semiconductor materials may be used for the conductive film. For example, a single layer containing as its main constituent aluminum (Al), tantalum (Ta), copper (Cu), niobium (Nb), hafnium (Hf), zirconium (Zr), titanium (Ti), chromium (Cr), silicon (Si) or silicide may be used, or may be used multi-layers thereof. A film thickness of 10 to 500 nm can be used for the conductive film. A 400 nm aluminum film is deposited as the conductive film for Embodiment 6.

The conductive film is then patterned using masks 1154 and 1155, and the material layers that will form the gate wirings 1156 and 1157 are formed, as shown in FIG. 11A.

In this embodiment, a first anodic oxidation is performed on the material layers that will form the gate wirings 1156 and 1157, forming anodic oxidation films 1158 and 1159, which are porous (porous type), as shown in FIG. 11B. Additionally, after removal of the masks 1154 and 1155, a second anodic oxidation is performed, forming fine oxidation films (barrier type) 1231 and 1331, and then forming gate wirings 1330 and 1230, as shown in FIG. 11C.

Additionally, it is also acceptable to add a process that forms a protective film from an insulating film covering the gate wiring, in order to protect the gate wiring, without performing the above anodic oxidation.

Figure 12A:
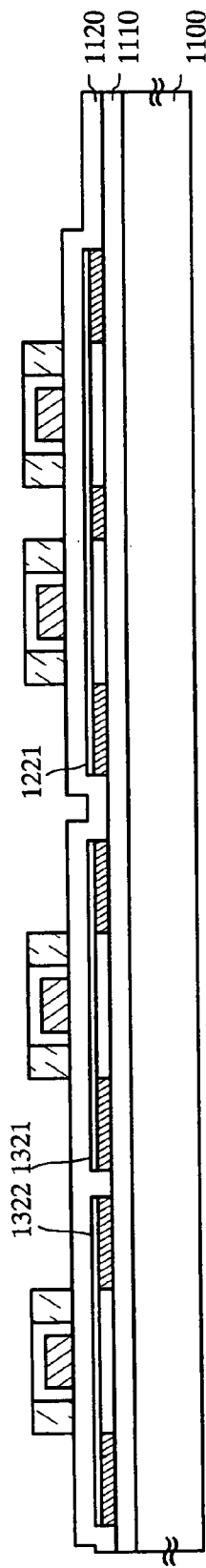
FIGS. 12A, 12B, and 12C are drawings showing an example of the manufacturing process according to Embodiment 6 of thee present invention.
Figure 12B:
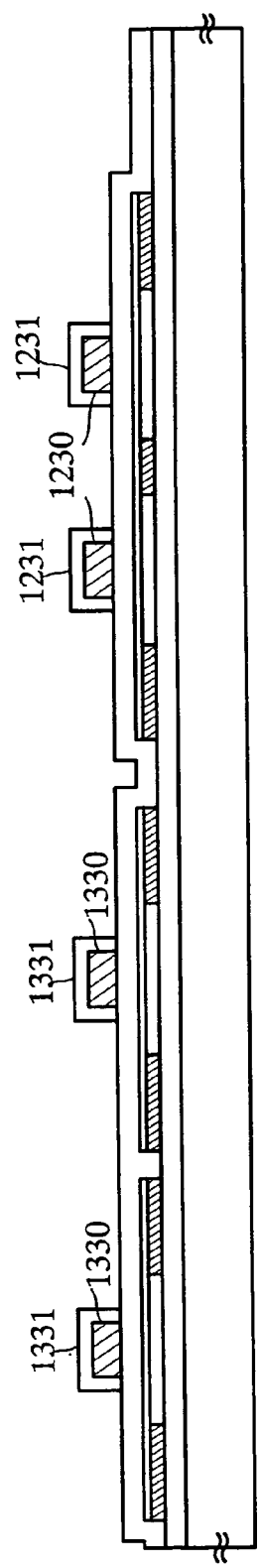
Figure 12C:
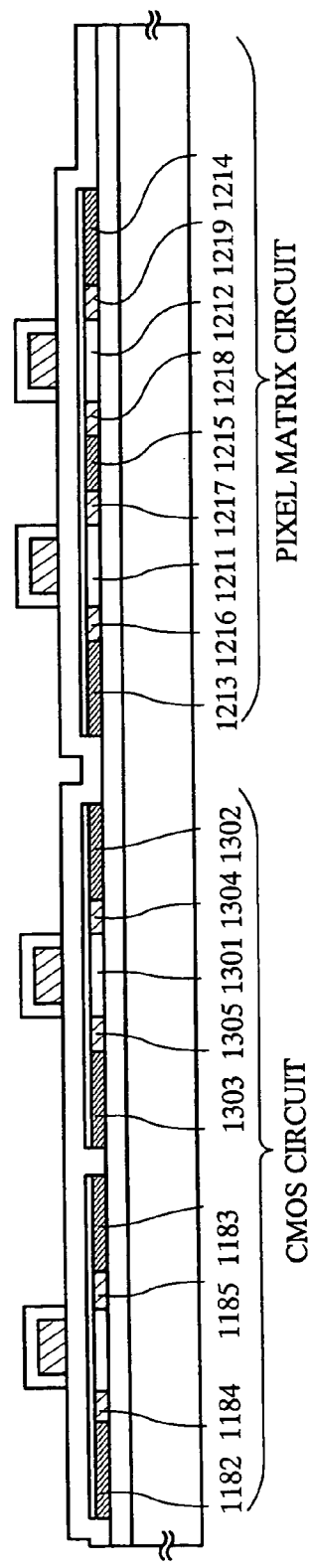

Next, the gate wirings 1330 and 1230, as well as the anodic oxidation films 1158, 1159, 1331, and 1231 are used as a mask, and a high concentration of impurities that provide n-type conductivity is added in the active layer, as shown in FIG. 12A. The porous anodic oxidation films 1158 and 1159 are then removed, as shown in FIG. 12B. Next, the gate wirings 1330 and 1230, as well as the anodic oxidation films 1331 and 1231 are used as a mask, and a low concentration of impurities that provide n-type conductivity is added in the active layer, as shown in FIG. 12C. Phosphorous is used as an impurity to provide n-type conductivity in Embodiment 6.

After the impurity doping process described above is carried out, heavy impurity regions ($n^+$-type regions) 1302, 1303, and 1213 to 1215 act as source and drain regions, while light impurity regions ($n^-$-type regions) 1304, 1305, and 1216 to 1219 act as LDD regions. Regions not implanted with either phosphorous or boron ions become intrinsic, or essentially intrinsic, channel formation regions 1301, 1211, and 1212, used to route the carrier.

Figures 13A, 13B:
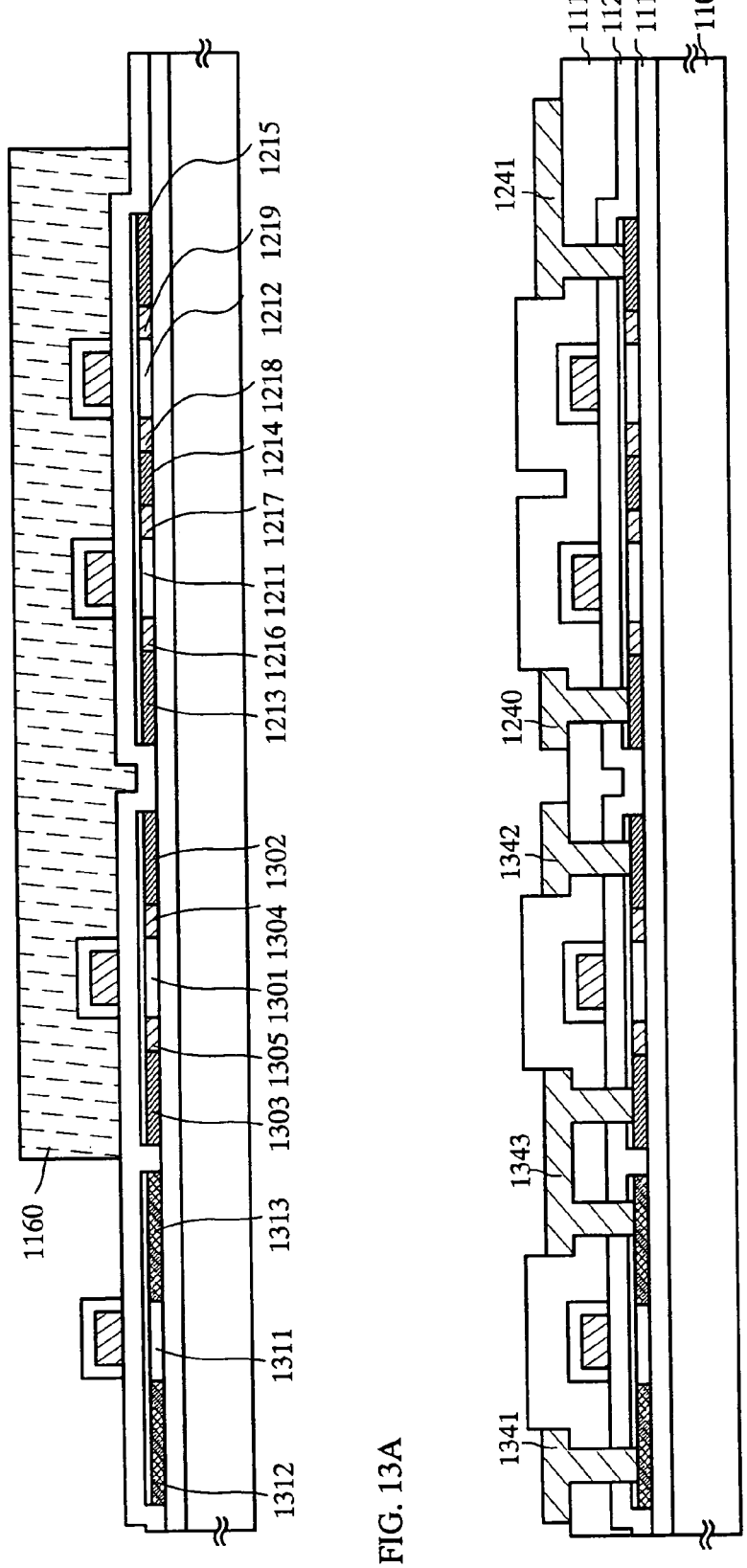
FIGS. 13A and 13B are drawings showing the example manufacturing process for Embodiment 6 of the present invention.

Next, the n-channel TFT is covered with a mask 1160, and impurities are added in the active layer to give it p-type conductivity using as a mask the gate wiring, as shown in FIG. 13A. In addition, it is possible to form a mask that will allow for the selective adding of impurities to a preset area of the active layer. Ion implantation, plasma doping, laser doping, and other well-known methods may be used as a means for adding impurities. However, the dose, the acceleration voltage, and other doping conditions are regulated in order to ensure that the impurity ions are added to preset locations in a desired amount. Boron is used to provide p-type conductivity in Embodiment 6. After the impurity doping process described above is carried out, heavy impurity regions (p$^+$-type regions) 1312 and 1313 act as source and drain regions, while an intrinsic, or essentially intrinsic, channel formation region 1311 is also present.

Next, a well-known technique such as thermal annealing or laser annealing is used in order to obtain an activation effect of the impurities in the source and drain regions, or to get a restorative effect for any damage to the active layer crystal structure that was caused during the doping process. In Embodiment 6, after irradiation by laser light with a pulse frequency of 50 Hz, and a laser energy density of 179 mJ/cm$^2$, thermal annealing is performed (in a nitrogen atmosphere, 405° C., 2 hours.)

Afterward, it is also acceptable to form a passivation film by covering with a silicon nitride oxide film, silicon nitride film, etc., in order to protect the work. In addition, although in Embodiment 6 the insulating film 1120 is not patterned, it is acceptable to perform patterning of the insulating film 1120 to a desired shape before or after the impurity adding process. It is also acceptable to selectively remove the insulating films 1221, 1321, and 1322 before or after the impurity adding process.

The mask 1160 is next removed, and then a first interlayer insulating film 1111, a silicon nitride oxide (SiOxNy) film in the Embodiment, is formed, and then after contact holes are formed to expose the source and drain regions, a metallic film is formed. This metallic film is patterned, forming metallic wirings 1341 to 1343, 1240, and 1241 that provide contact with the source and drain regions. Finally this is hydrogenated in a hydrogen atmosphere at 350° C. for 2 hours (FIG. 13B).

The n-channel TFT and p-channel TFT are manufactured by performing these processes.

Next, a second interlayer insulating film 1112 is formed by spin coating an acrylic resin to a thickness of 1 µm. The second interlayer insulating film 1112 is then etched, and after contact holes are formed, a 300 nm Ti metallic film is deposited. After then patterning the metallic film, a black mask 1250 and lead wires 1351 and 1352 are formed.

Next, a third interlayer insulating film 1113 is formed by an acrylic resin. In Embodiment 6 the third interlayer insulating film 1113 is formed by spin coating to a thickness of 3 µm.

A contact hole is then formed, and a pixel electrode 1260 is formed. In Embodiment 6, first a transparent conductive film, for example, an ITO film is sputtered to a thickness of 100 nm, and then it is patterned, forming the pixel electrode 1260. As a pixel electrode, a compound comprising indium oxide and zinc oxide can be also used instead of ITO. Finally, this is treated with heat for 1 hour at 350° C. in a hydrogen atmosphere, reducing defects throughout the semiconductor layers. The conditions shown in FIG. 9 are thus obtained.

Figure 9:
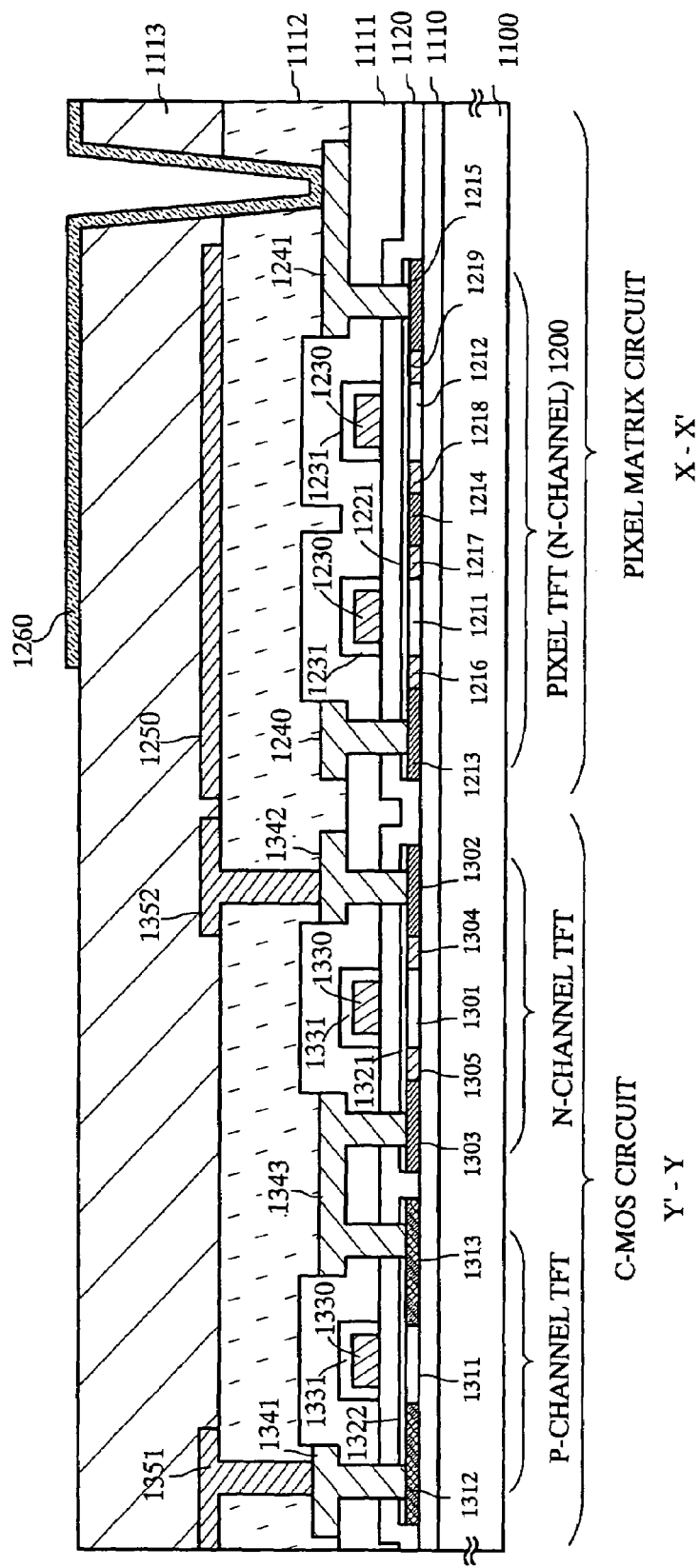
FIG. 9 is a drawing showing an example of the structure according to Embodiment 6 of the present invention.

Although in FIG. 9 a double gate structure pixel matrix TFT is used for the explanation, the present invention may also be applied to single gate, triple gate, and other multiple gate structures.

Figure 14A:
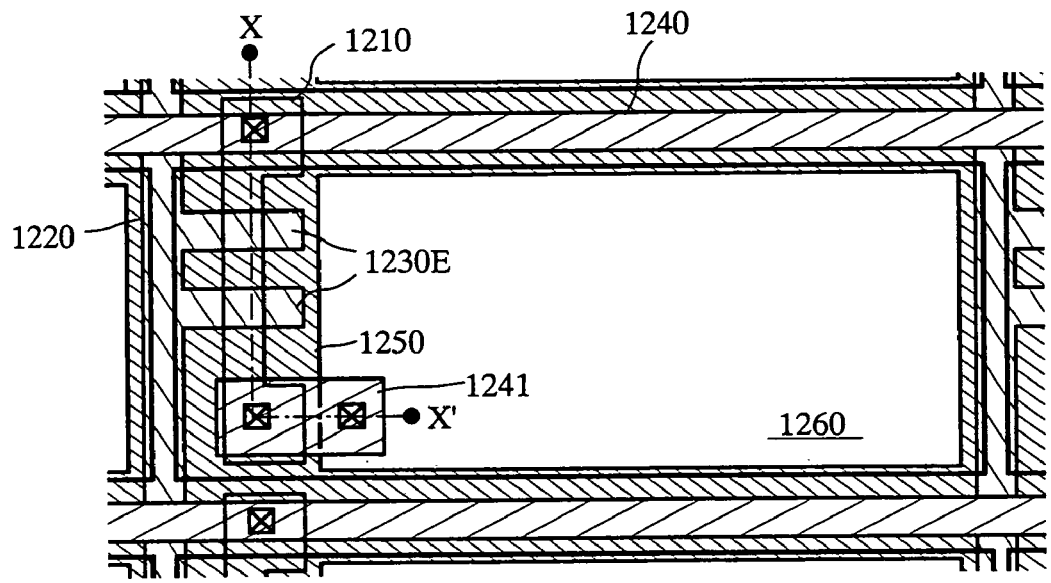
FIGS. 14A and 14B are drawings showing top views of the structure according to Embodiment 6 of the present invention.
Figure 14B:
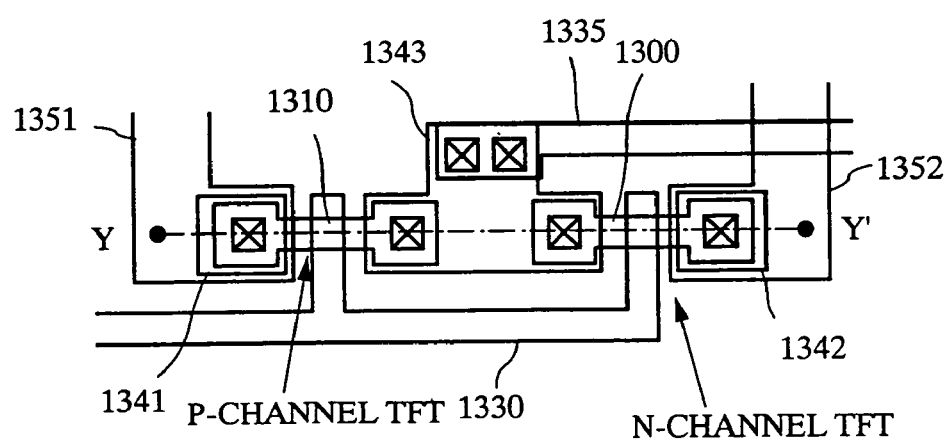

FIGS. 14A and 14B are equivalent to top views of the drawing shown in FIG. 9. The portion cut along the dotted line X–X' corresponds to the cross sectional view of the pixel matrix circuit construction in FIG. 9, while the portion cut along the dotted line Y–Y' corresponds to the cross sectional view of the CMOS circuit construction. An active layer 1210, a scanning line 1220, a gate wiring 1230E, a signal line 1240, a drain electrode 1241, a black mask 1250, and a pixel electrode 1260 are all shown in FIG. 14A. In FIG. 14B, active layers 1300 and 1310, a gate wiring 1330, a drain wiring 1335, source electrodes 1341 and 1342, a drain electrode 1343, and source wirings 1351 and 1352 are shown.

The TFT structure shown in Embodiment 6 is an example of a top gate type, and places no special limitations on the structure of Embodiment 6. In addition, Embodiment 6 shows the manufacture of a transmissive LCD, which is just one example of a semiconductor device. Note that by constructing the pixel electrode with a highly reflective metal film, instead of ITO, and then suitably changing the patterning of the pixel electrode, the operator can easily manufacture a reflective LCD. In addition, by using as a base film a structure consisting of a heat resistant metal film and an insulating film layered thereon, or a structure comprising an insulating film formed on top of aluminum nitride during manufacture of the reflective LCD, the metallic film underneath the insulating film will work effectively as a heat radiation layer. Also note that operators may suitably change the order of the above processes as needed.

It is possible to combine Embodiment 6 with Embodiment 5.

EMBODIMENT 7

This embodiment takes an example in which a process that differs from that of Embodiment 6 is used to obtain a crystalline semiconductor film. In Embodiment 7 an additional process is performed before formation of the semiconductor film of Embodiment 6, which places a catalytic element either selectively or over the entire semiconductor surface, in order to promote crystallization. The basic structure of Embodiment 7 is similar to that of Embodiment 1, therefore the focus of the description will be on the differences only.

A catalytic element to promote silicon crystallization is added to the semiconductor film bottom surface in Embodiment 7. Elements Ni, Fe, Co, Pt, Cu, Au, and Ge may be used either singly, or in combination, as the catalytic element for promoting silicon crystallization. Ni was chosen from those catalytic elements for Embodiment 7 due to its quick diffusion speed throughout the amorphous silicon film, and the extremely good crystallinity was obtained.

In addition, there are no special limitations on what location the above catalytic element may be introduced. It is added either over the entire base film surface, or added to selective areas through use of a suitable mask.

Further, there are no special limitations on what type of processing method is used to introduce the catalytic element to the amorphous silicon film, provided that the process is able to place the catalytic elements in contact with the bottom surface of the amorphous silicon film, or is able to hold them within the amorphous silicon film itself. For example, sputtering, CVD, plasma processing, adsorption, ion implantation, and coating with a solution that contains the catalytic elements can be used. From this group, the process using a solution is useful in that it is easy to perform, and it is simple to regulate the catalytic element concentration. Several types of metallic salts can be used, with solvents ranging from water to alcohols, aldehydes, ethers, and other organic solvents. Mixtures of organic solvents and water may also be used. A coating method is employed in this embodiment. A solution containing between 1 to 1000 ppm nickel (per weight), with a value of between 10 and 100 ppm desirable, is coated. However, depending on the thickness of the amorphous silicon film, it may be necessary to adjust the concentration by adding a suitable amount of catalyst. An amorphous silicon film processed in this manner has a concentration of between $1\times10^{19}$ and $1\times10^{21}$ atoms/cm$^3$.

After introducing catalytic elements into the amorphous silicon film as described, an insulating layer is formed without exposure to the atmosphere, and crystallization is performed through the insulating layer by laser light irradiation in order to obtain a crystallized silicon film. In addition, a high temperature heating process may be substituted for laser irradiation. Further, a gettering process may be added after crystallization in order to reduce the concentration of the catalytic element in the film.

If further processing is performed according to Embodiment 6, the semiconductor device of FIG. 9 can be obtained.

EMBODIMENT 8

This embodiment takes an example in which a process that differs from that of Embodiment 6 is used to obtain a crystalline semiconductor film. In Embodiment 6, after heat treatment is given on the base film, a semiconductor film is formed by sputtering, but in Embodiment 8, the base film, the semiconductor film and the insulating film are formed in succession, without exposure to the atmosphere.

First, a plastic substrate is prepared. A silicon nitride film is formed on top of the substrate by sputtering to act as a base film, and an amorphous silicon film is laminated, also by sputtering, to act as a semiconductor film. The two films are formed in succession, without exposure to the atmosphere. It is possible to create a clean interface between the base film and the semiconductor film with this processing method. In addition, sputtering is used to successively form a 20 nm insulating film of silicon oxide, without exposure to the atmosphere. This can provide a clean interface between the semiconductor film and the insulating film.

Next, laser light irradiation is used to form a crystalline semiconductor film by crystallizing the amorphous silicon semiconductor film through the insulating film.

If further processing is performed according to Embodiment 6, the semiconductor device of FIG. 9 can be obtained.

EMBODIMENT 9

This embodiment takes an example in which a multi-chamber (cluster tool) structured apparatus such as the one shown in FIGS. 17A and 17B is used to form the laminates of films formed by sputtering in Embodiments 1 to 3, and 6 to 8.

In Embodiment 9, a silicon oxide film is formed as a base film in a first chamber 19, fitted with a fused quartz target, at a deposition pressure of 0.6 Pa, and using a sputtering gas comprised of a 0 to 50% mixture ratio of $O_2$ and Ar gasses. A 30% mixture ratio is used here.

Next, without exposure to the atmosphere, the substrate is conveyed to a second chamber 20, fitted with a silicon target, in which Ar gas is used as the sputtering gas in order to form a semiconductor film of amorphous silicon.

Then, without exposure to the atmosphere, the substrate is conveyed to a third chamber 21, fitted with a fused quartz target. An insulating film made from silicon oxide is formed in the third chamber 21, at a deposition pressure of 0.6 Pa, and using a sputtering gas comprised of a 20 to 80% mixture ratio of $O_2$ and Ar gasses. A 30% mixture ratio is used in here.

It is desirable that a well-known cleaning process be carried out on the surface on which the film is to be formed before forming the film in the sputtering process.

Next, the semiconductor film, made of an amorphous silicon film, is crystallized by laser light irradiation through the insulating film, forming a crystalline semiconductor film.

If further processing is performed according to Embodiment 6, the semiconductor device of FIG. 9 can be obtained.

EMBODIMENT 10

A top gate type TFT is used for the explanation of Embodiment 6, however the present invention can also be applied to a bottom gate type TFT, such as an inverted stagger type TFT. In Embodiment 10, FIGS. 15A to 15D and FIGS. 16A to 16C are used to explain the manufacture of a TFT (bottom gate type TFT) that differs from that of Embodiment 6.

Figure 15A:
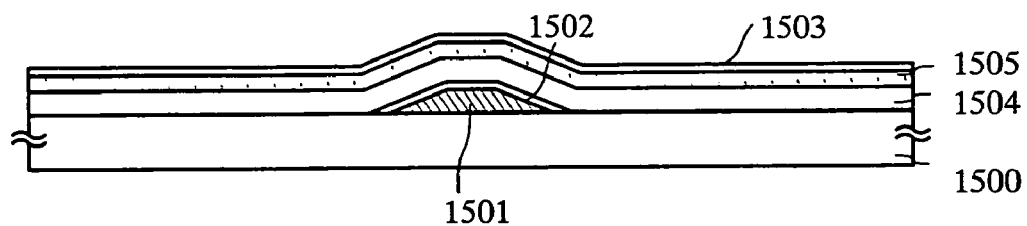
FIGS. 15A to 15D are drawings showing an example of a manufacturing process according to Embodiment 10 of the present invention.

A substrate 1500, and a gate wiring 1501 consisting of a laminate of tantalum (Ta) and tantalum nitride (TaN), are shown in FIG. 15A. To simplify the drawing, the laminate structure of the base film and gate wiring is not shown.

An anodic oxidation process is then performed, forming a protective film 1502 on the surface of the gate wiring. It is also possible to substitute an oxide film by a normal oxidation process for the anodic oxidation film by the anodic oxidation process. Next, a gate insulating film 1504 is formed on top of the gate wiring 1501. A silicon oxide film formed by sputtering is used as the gate insulating film 1504 for Embodiment 10.

Then, without exposure to the atmosphere, an amorphous silicon film 1505 including microcrystalline is formed by sputtering on top of the gate insulating film 1504, and on top of this an insulating film 1503, made from a silicon nitride film, is also formed, as shown in FIG. 15A.

Figure 15B:
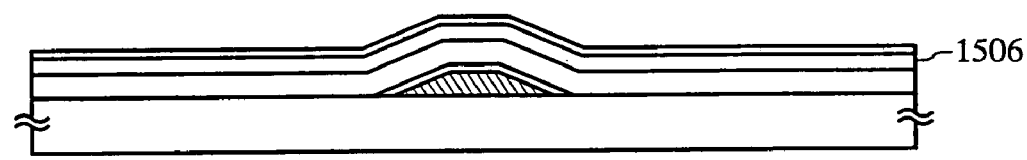

A crystallization process using laser light or heat is next carried out through the insulating film 1503, forming a crystalline semiconductor film 1506, as shown in FIG. 15B.

Figure 15C:
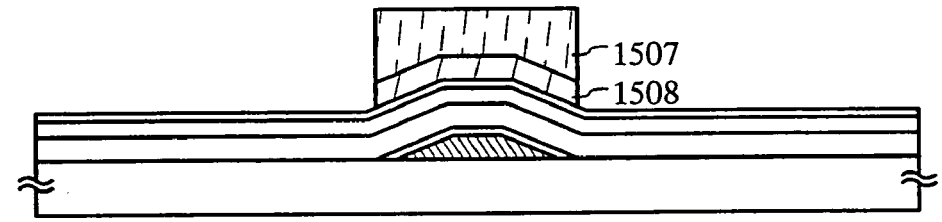

Next, a resist mask 1507 is used to form a mask 1508 made from a silicon oxide film, as shown in FIG. 15C.

Figure 15D:
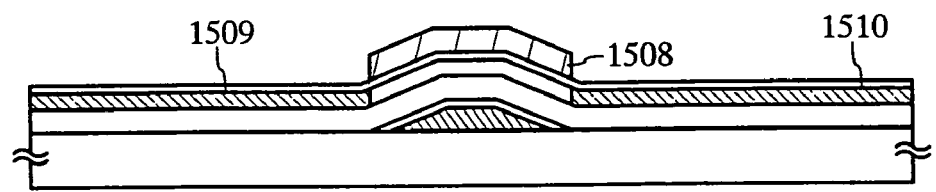

Impurities are then added after removing the resist mask 1507, forming impurity regions 1509 and 1510, as shown in FIG. 15D.

Figure 16A:
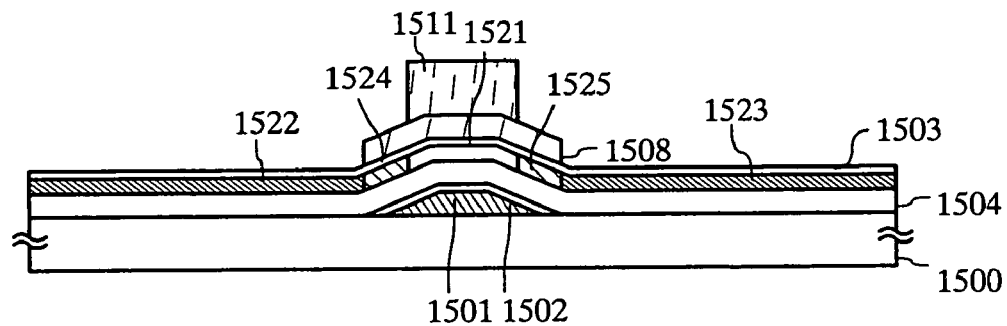
FIGS. 16A, 16B, and 16C are drawings showing an example of the manufacturing process according to Embodiment 10 of the present invention.

Next, the area that will become the channel formation region is covered by a resist mask 1511, and a low concentration of impurities is added. This forms light impurity regions 1524 and 1525, a channel formation region 1521, and heavy impurity regions 1522 and 1523, as shown in FIG. 16A.

It is also acceptable to remove the insulating film 1503 either before or after the adding the impurity.

Figure 16B:
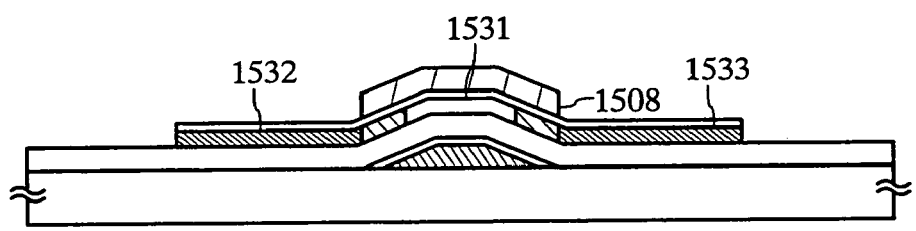

The active layer is patterned next, forming a source region 1532 and a drain region 1533, as shown in FIG. 16B.

Figure 16C:
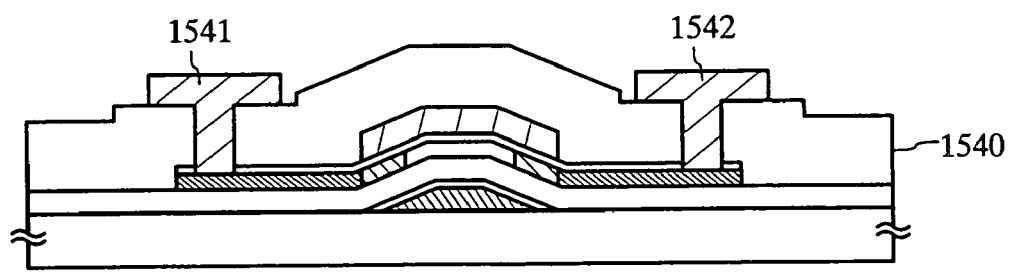

An interlayer insulating film 1540 is formed next, as are wirings 1541 and 1542, as shown in FIG. 16C.

Note that Embodiment 10 only contains an explanation of a manufacturing process for a single inverted stagger type TFT. However, by referring to the manufacturing process outlined in Embodiment 6, it is simple to manufacture CMOS circuits and to form pixel matrix circuits using the inverted stagger type TFT of Embodiment 10. Further explanation has therefore been omitted.

EMBODIMENT 11

The present invention can generally be applied to all previous and current IC technologies. Namely, it is applicable to all semiconductor circuits currently on the market. For example, it is applicable to microprocessors like integrated circuit RISC and ASIC processors, to signal processing circuits like those used as driver circuits for liquid crystals (a D/A converter, a γ correction circuit, a signal partitioning circuit, etc.), and to high frequency circuits such as those found in portable equipment (cellular phones, PHS phones, mobile computers).

In addition, semiconductor circuits like microprocessors are loaded into a wide array of electronic equipment and function as the nucleus of such equipment. Representative examples of electronic equipment include personal computers, portable information terminals, etc., namely all home electronic products. Further, computers that control vehicles (automobiles, trains, etc.) can also be given as examples. The present invention can be applied to this wide array of semiconductor devices.

It is possible to employ any of the previous structures of Embodiments 1 through 10, or to freely combine them, in order to manufacture the semiconductor devices shown in this embodiment.

EMBODIMENT 12

A TFT formed through carrying out the present invention may be applied to various electro-optical devices. Namely, the present invention may be embodied in all the electronic equipments that incorporate those electro-optical devices as display media.

As such an electronic equipment, a video camera, a digital camera, a head-mount display (goggle-type display), a wearable display, a navigation system for vehicles, a personal computer, and a portable information terminal (a mobile computer, a cellular phone, or an electronic book) may be enumerated. Examples of those are shown in FIGS. 18A to 18H.

Figure 18A:
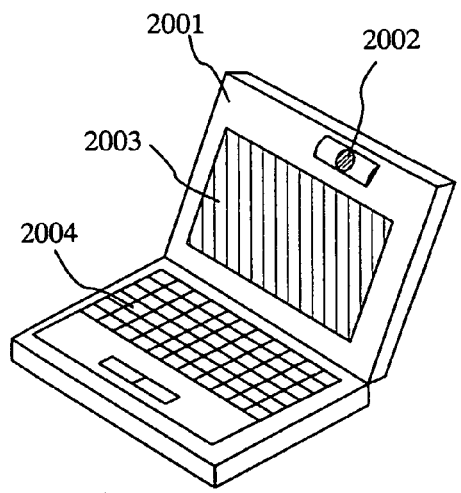
FIGS. 18A to 18H are drawings showing an example of electronic equipments according to Embodiment 12 of the present invention.

FIG. 18A shows a personal computer comprising a main body 2001, an image inputting unit 2002, a display device 2003, and a key board 2004. The present invention is applicable to the image inputting unit 2002, the display device 2003, and other signal control circuits.

Figure 18B:
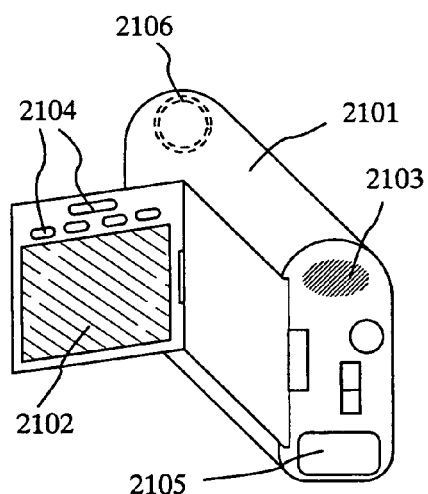

FIG. 18B shows a video camera comprising a main body 2101, a display device 2102, a voice input unit 2103, operation switches 2104, a battery 2105, and an image receiving unit 2106. The present invention is applicable to the display device 2102, the voice input unit 2103, and other signal control circuits.

Figure 18C:
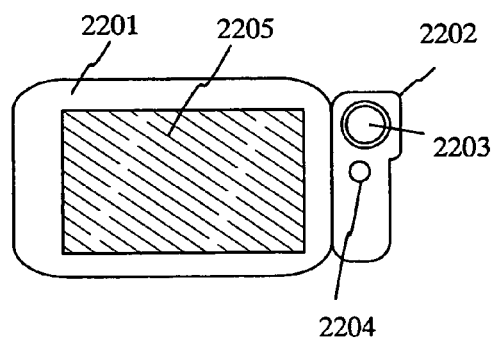

FIG. 18C shows a mobile computer comprising a main body 2201, a camera unit 2202, an image receiving unit 2203, an operation switch 2204, and a display device 2205. The present invention is applicable to the display device 2205 and other signal control circuits.

Figure 18D:
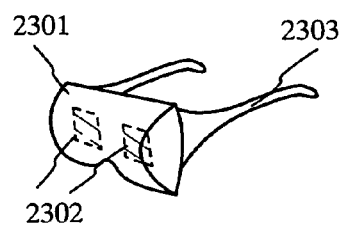

FIG. 18D shows a goggle-type display comprising a main body 2301, display devices 2302 and arm portions 2303. The present invention is applicable to the display devices 2302 and other signal control circuits.

Figure 18E:
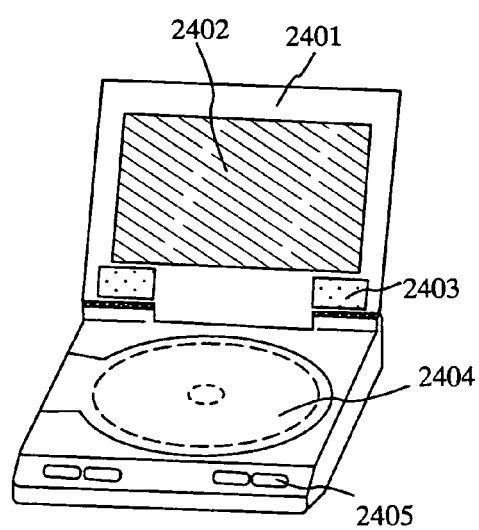

FIG. 18E shows a player that employs a recording medium in which programs are recorded (hereinafter referred to as recording medium), and comprises a main body 2401, a display device 2402, a speaker unit 2403, a recording medium 2404, and an operation switch 2405. Incidentally, this player uses as the recording medium a DVD (digital versatile disc), a CD and the like to serve as a tool for enjoying music or movies, for playing video games and for connecting to the Internet. The present invention is applicable to the display device 2402 and other signal control circuits.

Figure 18F:
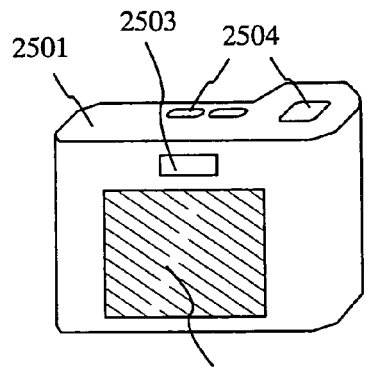

FIG. 18F shows a digital camera comprising a main body 2501, a display device 2502, an eye piece section 2503, operation switches 2504, and an image receiving unit (not shown). The present invention is applicable to the display device 2502 and other signal control circuits.

Figure 18G:
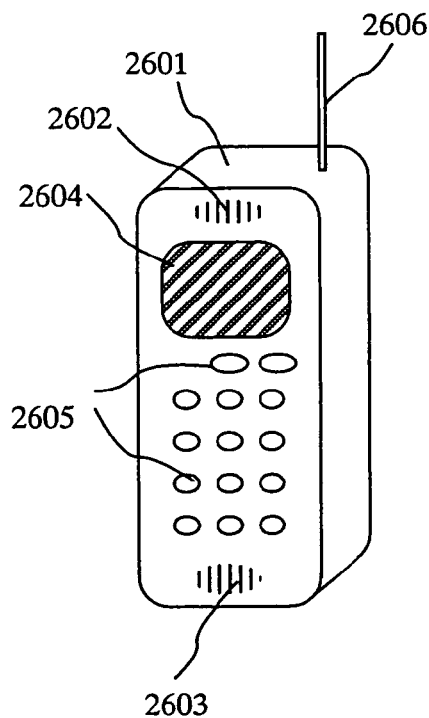

FIG. 18G shows a cellular phone comprising a main body 2601, a voice output portion 2602, a voice input portion 2603, a display device 2604, operation switches 2605, and an antenna 2606.

Figure 18H:
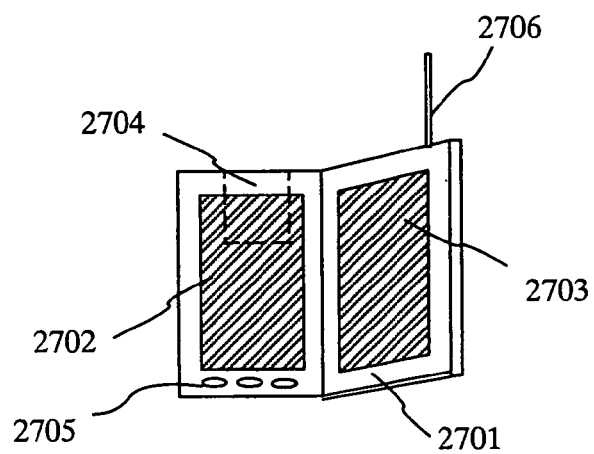

FIG. 18H shows a portable book (an electronic book) comprising a main body 2701, display devices 2702 and 2703, a recording medium 2704, operation switches 2705, and an antenna 2706.

As described above, the present invention has so wide application range that it is applicable to electronic equipments in any fields. In addition, the electronic equipment of this embodiment may be realized with any construction obtained by combining Embodiments 1 to 11.

EMBODIMENT 13

A TFT formed through carrying out the present invention may be applied to various electro-optical devices. Namely, the present invention may be embodied in all the electronic equipments that incorporate those electro-optical devices as display media.

As such an electronic equipment, projectors (rear-type projector or front-type projector) are exemplified. Examples of those are shown in FIGS. 19A to 19D.

Figure 19A:
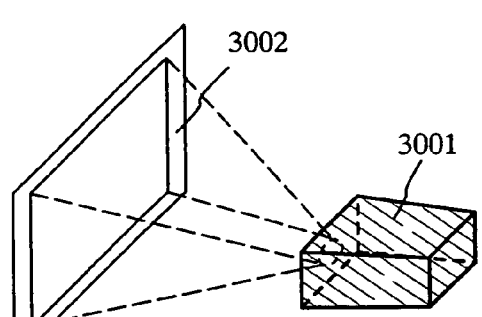
FIGS. 19A to 19D are drawings showing an example of electronic equipments according to Embodiment 13 of the present invention.

FIG. 19A shows a front-type projector comprising a display device 3001 and a screen 3002. The present invention is applicable to the display device and other signal control circuits.

Figure 19B:
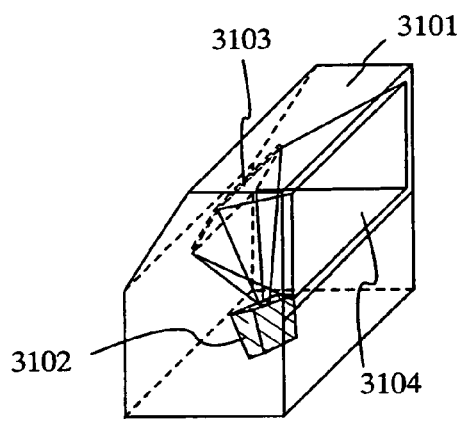

FIG. 19B shows a rear-type projector comprising a main body 3101, a display device 3102, a mirror 3103, and a screen 3104. The present invention is applicable to the display device and other signal control circuits.

Figure 19C:
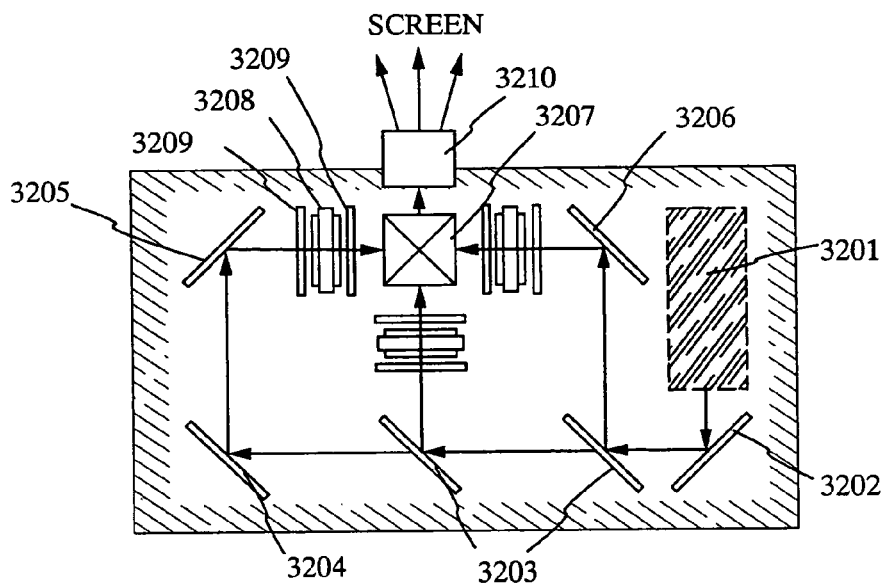

FIG. 19C is a diagram showing an example of the structure of the display devices 3001 and 3102 in FIGS. 19A and 19B. The display device 3001 or 3102 comprises a light source optical system 3201, mirrors 3202 and 3204 to 3206, dichroic mirrors 3203, a prism 3207, liquid crystal display devices 3208, phase difference plates 3209, and a projection optical system 3210. The projection optical system 3210 is comprised of an optical system including a projection lens. This embodiment shows an example of "three plate type", but not particularly limited thereto. For instance, the invention may be applied also to "single plate type". Further, in the light path indicated by an arrow in FIG. 19C, an optical system such as an optical lens, a film having a polarization function, a film for adjusting a phase difference, an IR film may be suitably provided by a person who carries out the invention.

Figure 19D:
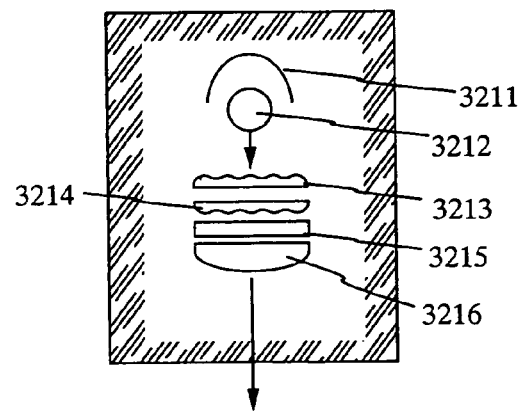

FIG. 19D is a diagram showing an example of the structure of the light source optical system 3201 in FIG. 19C. In this embodiment, the light source optical system 3201 comprises a reflector 3211, a light source 3212, lens arrays 3213 and 3214, a polarization conversion element 3215, and a condenser lens 3216. The light source optical system shown in FIG. 19D is merely an example thereof, and is not particularly limited. For instance, on discretion of a person who carries out the invention, the light source optical system may be provided with an optical system such as an optical lens, a film having a polarization function, a film for adjusting the phase difference, and an IR film.

As described above, the present invention has so wide application range that it is applicable to electronic equipments in any fields. In addition, the electronic equipment of this embodiment may be realized with any construction obtained by combining Embodiments 1 to 10. However, though mentioning this would be unnecessary, the projectors in this embodiment are transmissive liquid crystal display devices and hence cannot be applied to reflective liquid crystal display devices.

When manufacturing the semiconductor devices shown in this embodiment, any construction in Embodiments 1 through 10 may be adopted, and Embodiments may be freely combined. Also, the electro-optical devices and the semiconductor circuits may be used in combination.

EMBODIMENT 14

This example demonstrates a process for producing an EL (electroluminescence) display device according to the invention of the present application.

Figure 20A:
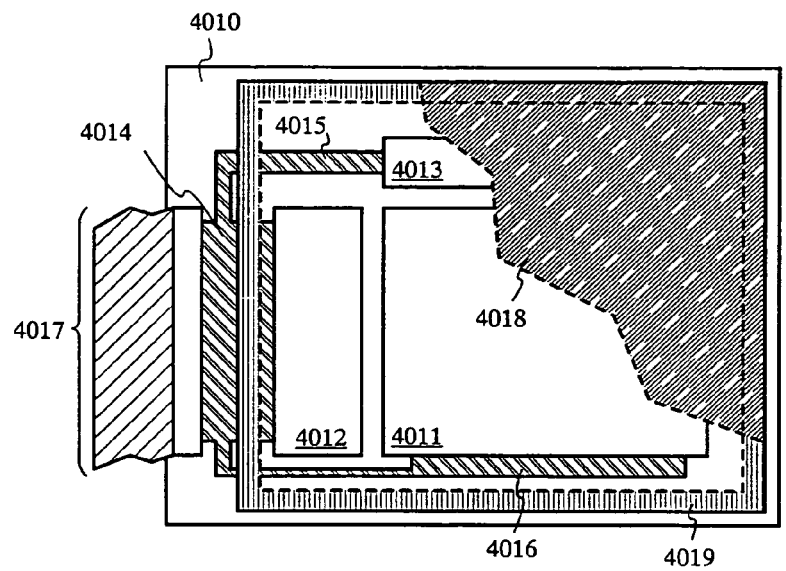
FIGS. 20A and 20B are drawings showing an example of an electroluminescence display device to Embodiment 14 of the present invention.

FIG. 20A is a top view showing an EL display device which was produced according to Embodiments 1–4 and 6–10 of the present invention. In FIG. 20A, there are shown a substrate 4010, a pixel portion 4011, a source side driving circuit 4012, and a gate side driving circuit 4013, each driving circuit connecting to wirings 4014–4016 which reach FPC 4017 leading to external equipment.

The pixel portion, preferably together with the driving circuits, is enclosed by a sealing material (or a housing material) 4018. The sealing material 4018 may be a concave metal plate or glass plate which encloses the element; alternatively, it may be an ultraviolet curable resin. When a metal plate having a concave portion to enclose the element is employed as the sealing material, the concave metal plate should be fixed to the substrate 4010 with an adhesive 4019 so that an airtight space is formed between the metal plate and the substrate 4010. Thus, the EL element is completely sealed in the airtight space and completely isolated from the outside air.

It is desirable that the cavity 4020 between the sealing material 4018 and the substrate 4010 be filled with an inert gas (such as argon, helium, and nitrogen) or a desiccant (such as barium oxide), so as to protect the EL element from degradation by moisture.

Figure 20B:
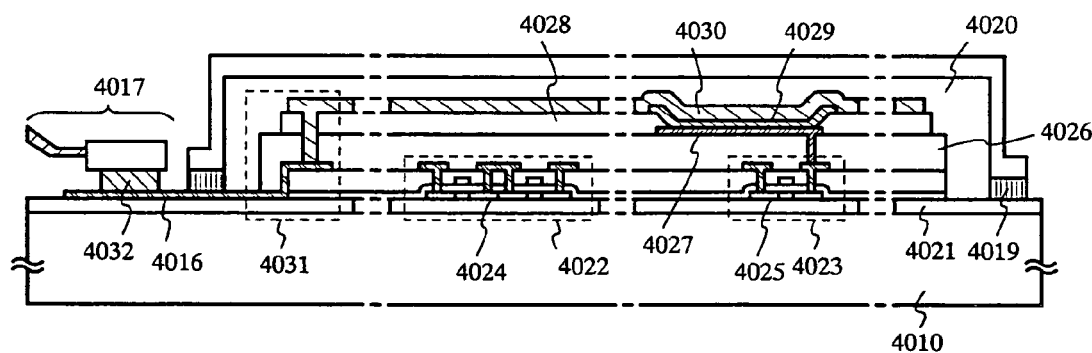

FIG. 20B is a sectional view showing the structure of the EL display device in this Embodiment. There is shown a substrate 4010, a base film 4021, a TFT 4022 for the driving circuit, and a TFT 4023 for the pixel portion. (The TFT 4022 shown is a CMOS circuit consisting of an n-channel type TFT and a p-channel type TFT. The TFT 4023 shown is the one which controls current to the EL element.) Needless to say, each of these TFTs may have a top gate structure shown in Embodiments 1–3 and 6–8 or a bottom gate structure shown in Embodiments 4 and 10.

The present invention may be employed to form the semiconductor layer which becomes the active layer 4024 of TFT 4022 for the driving circuit and the active layer 4025 of TFT 4023 for the pixel portion.

Upon completion of TFT 14022 for the driving circuit and TFT 4023 for the pixel portion, with their active layer being the semiconductor layer formed according to the present invention, a pixel electrode 4027 is formed on the interlayer insulating film (a leveling film) 4026 made of a resin. This pixel electrode is a transparent conductive film which is electrically connected to the drain of TFT 4023 for the pixel portion. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecular material or a high-molecular material (polymer). When the low-molecular material is used, a vapor deposition can be applied, and when the high molecular material (polymer) is used, a simple method such as spin coating, printing, or ink-jet method can be applied.

In this Embodiment, the EL layer is formed by vapor deposition through a shadow mask. The resulting EL layer permits each pixel to emit light differing in wavelength (red, green, and blue). Thus, this realizes the color display. Alternative systems available include the combination of a color conversion layer (CCM) and a color filter and the combination of white light emitting layer and color filter. Needless to say, the EL display device may be monochromatic.

On the EL layer 4029 is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without exposure to air. In this Embodiment, the desired film was formed by using a film-forming apparatus of a multi-chamber system (a cluster tool system).

The multi-layer structure composed of a lithium fluoride film and an aluminum film is used in this Embodiment as the cathode 4030. To be concrete, the EL layer 4029 is coated by vapor deposition with a lithium fluoride film (1 nm thick) and an aluminum film (300 nm thick) sequentially thereon. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

The wiring 4016 is electrically connected to FPC 4017 through the gap (filled with an adhesive 4019) between the sealing material 4018 and the substrate 4010. As in the wiring 4016 explained above, other wirings 4014 and 4015 are also electrically connected to FPC 4017 under the sealing material 4018.

The above-mentioned EL display device constructed according to the present invention is advantageous in that the semiconductor film used as an active layer of a TFT can have high electrical characteristics. Therefore, the EL display comprising TFTs which has been produced with accordance to the present invention can produce display images of good quality.

According to the present invention, an amorphous silicon film is formed by the sputtering process, which enables a TFT to be manufactured in a highly safe work environment. It is also easy to regulate the film quality with sputtering, enabling an amorphous semiconductor film to be formed as desired.

In addition, films formed by sputtering have good adhesion, so it is possible to form an extremely high quality crystallized film, with interface of good adhesion, even when a low cost plastic or glass substrate is used. It is thus possible to use the present invention to manufacture a high performance semiconductor device.

Further, it is possible to obtain a semiconductor device with good electrical characteristics when using the present invention due to the clean interface that can be obtained between, especially, the channel formation region of the active layer and the insulating layer formed thereon.

Additionally, a TFT fabricated through the present invention has the mobility ($\mu_{max}$), which is the representative parameter for TFTs, between 50 to 500 cm$^2$/Vs (100 cm$^2$/Vs or more) for an n-channel type TFT, and between 20 to 300 cm$^2$/Vs (50 cm$^2$/Vs or more) for a p-channel type TFT.

What is claimed is:

1. A semiconductor device comprising:
a substrate;
a first thin film transistor for a driver circuit and a second thin film transistor for a pixel portion formed on an insulating surface over the substrate, wherein the second thin film transistor includes a wiring formed on the insulating surface;
at least one insulating film formed over the second thin film transistor;
a pixel electrode formed over the insulating film and electrically connected to the second thin film transistor;
an EL layer formed over the pixel electrode;
a second electrode formed over the EL layer;
a sealing material provided over the substrate and covering the first thin film transistor, the second thin film transistor, the insulating film, the pixel electrode, the EL layer and the second electrode,
wherein the sealing material is fixed to the substrate by an adhesive and the adhesive is directly in contact with the wiring on the insulating surface.

2. The semiconductor device according to claim 1, wherein each of the first thin film transistor and the second thin film transistor comprises an active layer formed by a sputtering method.

3. The semiconductor device according to claim 1, wherein the second electrode is a cathode.

4. The semiconductor device according to claim 1, wherein the sealing material is a glass plate.

5. The semiconductor device according to claim 1, wherein a cavity between the sealing material and the substrate is filled with an inert gas.

6. The semiconductor device according to claim 1, wherein a desiccant is contained in a cavity between the sealing material and the substrate.

7. The semiconductor device according to claim 1, wherein the wiring supplies a voltage to the second electrode.

8. The semiconductor device according to claim 1, wherein the wiring is connected to an FPC through an electrically conductive paste material.

9. A semiconductor device comprising:
a substrate;
a first thin film transistor for a driver circuit and a second thin film transistor for a pixel portion formed on an insulating surface over the substrate, wherein the second thin film transistor includes a wiring formed on the insulating surface;
at least one insulating film made of a resin formed over the second thin film transistor;
a pixel electrode formed over the insulating film and electrically connected to the second thin film transistor;
an EL layer formed over the pixel electrode;
a second electrode formed over the EL layer;
a sealing material provided over the substrate and covering the first thin film transistor, the second thin film transistor, the insulating film, the pixel electrode, the EL layer and the second electrode,
wherein the sealing material is fixed to the substrate by an adhesive and the adhesive is directly in contact with the wiring on the insulating surface.

10. The semiconductor device according to claim 9, wherein each of the first thin film transistor and the second thin film transistor comprises an active layer formed by a sputtering method.

11. The semiconductor device according to claim 9, wherein the second electrode is a cathode.

12. The semiconductor device according to claim 9, wherein the sealing material is a glass plate.

13. The semiconductor device according to claim 9, wherein a cavity between the sealing material and the substrate is filled with an inert gas.

14. The semiconductor device according to claim 9, wherein a desiccant is contained in a cavity between the sealing material and the substrate.

15. The semiconductor device according to claim 9, wherein the wiring supplies a voltage to the second electrode.

16. The semiconductor device according to claim 9, wherein the wiring is connected to an FPC through an electrically conductive paste material.

17. A semiconductor device comprising:
a substrate;
a thin film transistor having a wiring formed on an insulating surface over the substrate;
at least one insulating film formed over the thin film transistor;
a pixel electrode formed over the insulating film and electrically connected to the thin film transistor;
an EL layer formed over the pixel electrode;
a second electrode formed over the EL layer;
a sealing material provided over the substrate and covering the thin film transistor, the insulating film, the pixel electrode, the EL layer and the second electrode,
wherein the sealing material is fixed to the substrate by an adhesive and the adhesive is directly in contact with the wiring on the insulating surface.

18. The semiconductor device according to claim 17, wherein the thin film transistor comprises an active layer formed by a sputtering method.

19. The semiconductor device according to claim 17, wherein the second electrode is a cathode.

20. The semiconductor device according to claim 17, wherein the sealing material is a glass plate.

21. The semiconductor device according to claim 17, wherein a cavity between the sealing material and the substrate is filled with an inert gas.

22. The semiconductor device according to claim 17, wherein a desiccant is contained in a cavity between the sealing material and the substrate.

23. The semiconductor device according to claim 17, wherein the wiring supplies a voltage to the second electrode.

24. The semiconductor device according to claim 17, wherein the wiring is connected to an FPC through an electrically conductive paste material.

25. A semiconductor device comprising:
a substrate;
a thin film transistor having a wiring formed on an insulating surface over the substrate;
at least one insulating film made of a resin formed over the thin film transistor;
a pixel electrode formed over the insulating film and electrically connected to the thin film transistor;
an EL layer formed over the pixel electrode;
a second electrode formed over the EL layer;
a sealing material provided over the substrate and covering the thin film transistor, the insulating film, the pixel electrode, the EL layer and the second electrode,
wherein the sealing material is fixed to the substrate by an adhesive and the adhesive is directly in contact with the wiring on the insulating surface.

26. The semiconductor device according to claim 25, wherein the second electrode is a cathode.

27. The semiconductor device according to claim 25, wherein the sealing material is a glass plate.

28. The semiconductor device according to claim 25, wherein a cavity between the sealing material and the substrate is filled with an inert gas.

29. The semiconductor device according to claim 25, wherein a desiccant is contained in a cavity between the sealing material and the substrate.

30. The semiconductor device according to claim 25, wherein the wiring supplies a voltage to the second electrode.

31. The semiconductor device according to claim 25, wherein the wiring is connected to an FPC through an electrically conductive paste material.

32. The semiconductor device according to claim 25, wherein the thin film transistor comprises an active layer formed by a sputtering method.

33. A semiconductor device comprising:
a substrate;
a first thin film transistor for a driver circuit and a second thin film transistor for a pixel portion formed on an insulating surface over the substrate;
at least one insulating film formed over the second thin film transistor;
a pixel electrode formed over the insulating film and electrically connected to the second thin film transistor;
an EL layer formed over the pixel electrode;
a second electrode formed over the EL layer, wherein the second electrode is electrically connected to a wiring formed on the insulating surface; and
a sealing material provided over the substrate and covering the first thin film transistor, the second thin film transistor, the insulating film, the pixel electrode, the EL layer and the second electrode,
wherein the sealing material is fixed to the substrate by an adhesive and the adhesive is directly in contact with the wiring on the insulating surface.

34. The semiconductor device according to claim 33, wherein each of the first thin film transistor and the second thin film transistor comprises an active layer formed by a sputtering method.

35. The semiconductor device according to claim 33, wherein the second electrode is a cathode.

36. The semiconductor device according to claim 33, wherein the sealing material is a glass plate.

37. The semiconductor device according to claim 33, wherein a cavity between the sealing material and the substrate is filled with an inert gas.

38. The semiconductor device according to claim 33, wherein a desiccant is contained in a cavity between the sealing material and the substrate.

39. The semiconductor device according to claim 33, wherein the wiring is connected to an FPC through an electrically conductive paste material.

40. A semiconductor device comprising:
a substrate;
a thin film transistor formed on an insulating surface over the substrate;
at least one insulating film formed over the thin film transistor;
a pixel electrode formed over the insulating film and electrically connected to the thin film transistor;
an EL layer formed over the pixel electrode;
a second electrode formed over the EL layer, wherein the second electrode is electrically connected to a wiring formed on the insulating surface; and
a sealing material provided over the substrate and covering the thin film transistor, the insulating film, the pixel electrode, the EL layer and the second electrode,
wherein the sealing material is fixed to the substrate by an adhesive and the adhesive is directly in contact with the wiring on the insulating surface.

41. The semiconductor device according to claim 40, wherein the thin film transistor comprises an active layer formed by a sputtering method.

42. The semiconductor device according to claim 41, wherein the second electrode is a cathode.

43. The semiconductor device according to claim 41, wherein the sealing material is a glass plate.

44. The semiconductor device according to claim 41, wherein a cavity between the sealing material and the substrate is filled with an inert gas.

45. The semiconductor device according to claim 41, wherein a desiccant is contained in a cavity between the sealing material and the substrate.

46. The semiconductor device according to claim 41, wherein the wiring is connected to an FPC through an electrically conductive paste material.

* * * * *